(12) United States Patent
Taneda et al.

(10) Patent No.: US 8,736,522 B2
(45) Date of Patent: May 27, 2014

(54) DISPLAY DEVICE WITH THRESHOLD CORRECTION

(75) Inventors: Takayuki Taneda, Kanagawa (JP); Katsuhide Uchino, Kanagawa (JP); Yukihito Iida, Kanagawa (JP)

(73) Assignee: Sony Corporation, Tokyo (JP)

( * ) Notice: Subject to any disclaimer, the term of this patent is extended or adjusted under 35 U.S.C. 154(b) by 1069 days.

(21) Appl. No.: 12/453,149

(22) Filed: Apr. 30, 2009

(65) Prior Publication Data

US 2009/0295773 A1 Dec. 3, 2009

(30) Foreign Application Priority Data

May 29, 2008 (JP) .................................. 2008-140310

(51) Int. Cl.
*G09G 3/30* (2006.01)

(52) U.S. Cl.
USPC .............................................. 345/76; 345/77

(58) Field of Classification Search
USPC ............ 345/76–83; 315/169.3; 716/119–120, 716/126–133
See application file for complete search history.

(56) References Cited

U.S. PATENT DOCUMENTS

| | | | |
|---|---|---|---|
| 6,367,061 B1 * | 4/2002 | Kurokawa et al. ............. | 716/120 |
| 6,522,079 B1 * | 2/2003 | Yamada ...................... | 315/169.3 |
| 7,500,211 B2 * | 3/2009 | Komaki ........................ | 716/120 |
| 2001/0045571 A1 * | 11/2001 | Gandhi et al. ................. | 257/202 |
| 2003/0011424 A1 * | 1/2003 | Moon et al. .................... | 327/565 |
| 2003/0023936 A1 * | 1/2003 | McManus et al. ................ | 716/1 |
| 2006/0103640 A1 * | 5/2006 | Choi ............................. | 345/204 |
| 2006/0117276 A1 * | 6/2006 | Nishiwaki ......................... | 716/2 |
| 2007/0146277 A1 * | 6/2007 | Miyazawa ...................... | 345/92 |
| 2007/0157144 A1 * | 7/2007 | Mai et al. ........................ | 716/10 |
| 2007/0268210 A1 | 11/2007 | Uchino et al. | |
| 2008/0068307 A1 * | 3/2008 | Kawabe .......................... | 345/80 |
| 2009/0114994 A1 * | 5/2009 | Kim .............................. | 257/369 |

FOREIGN PATENT DOCUMENTS

| | | | |
|---|---|---|---|
| JP | 63-221325 | A | 9/1988 |
| JP | 2001-109405 | A | 4/2001 |
| JP | 2002-032037 | A | 1/2002 |
| JP | 2005-338592 | A | 12/2005 |
| JP | 2007-148215 | A | 6/2007 |
| JP | 2007-148219 | A | 6/2007 |
| JP | 2007-310311 | | 11/2007 |
| JP | 2008-010815 | A | 1/2008 |

OTHER PUBLICATIONS

Japanese Office Action issued Apr. 27, 2010 for corresponding Japanese Application No. 2008-140310.

* cited by examiner

*Primary Examiner* — Alexander Eisen
*Assistant Examiner* — Nelson Lam
(74) *Attorney, Agent, or Firm* — Rader, Fishman & Grauer PLLC

(57) ABSTRACT

A display device, including: a pixel array portion having pixel circuits disposed in a matrix, each of the pixel circuits including a drive transistor for generating a drive current, and an electro-optic element connected to an output terminal of the drive transistor, and power source supply lines as scanning lines through which pulse-like power source voltages are supplied to power source supply terminals of the drive transistors, respectively, wired therein; wherein power source contact portions through which the corresponding one of the power source supply terminals and the corresponding one of the power source supply lines are connected to each other are provided at predetermined distances from one another in a plurality of portions every drive transistor.

13 Claims, 21 Drawing Sheets

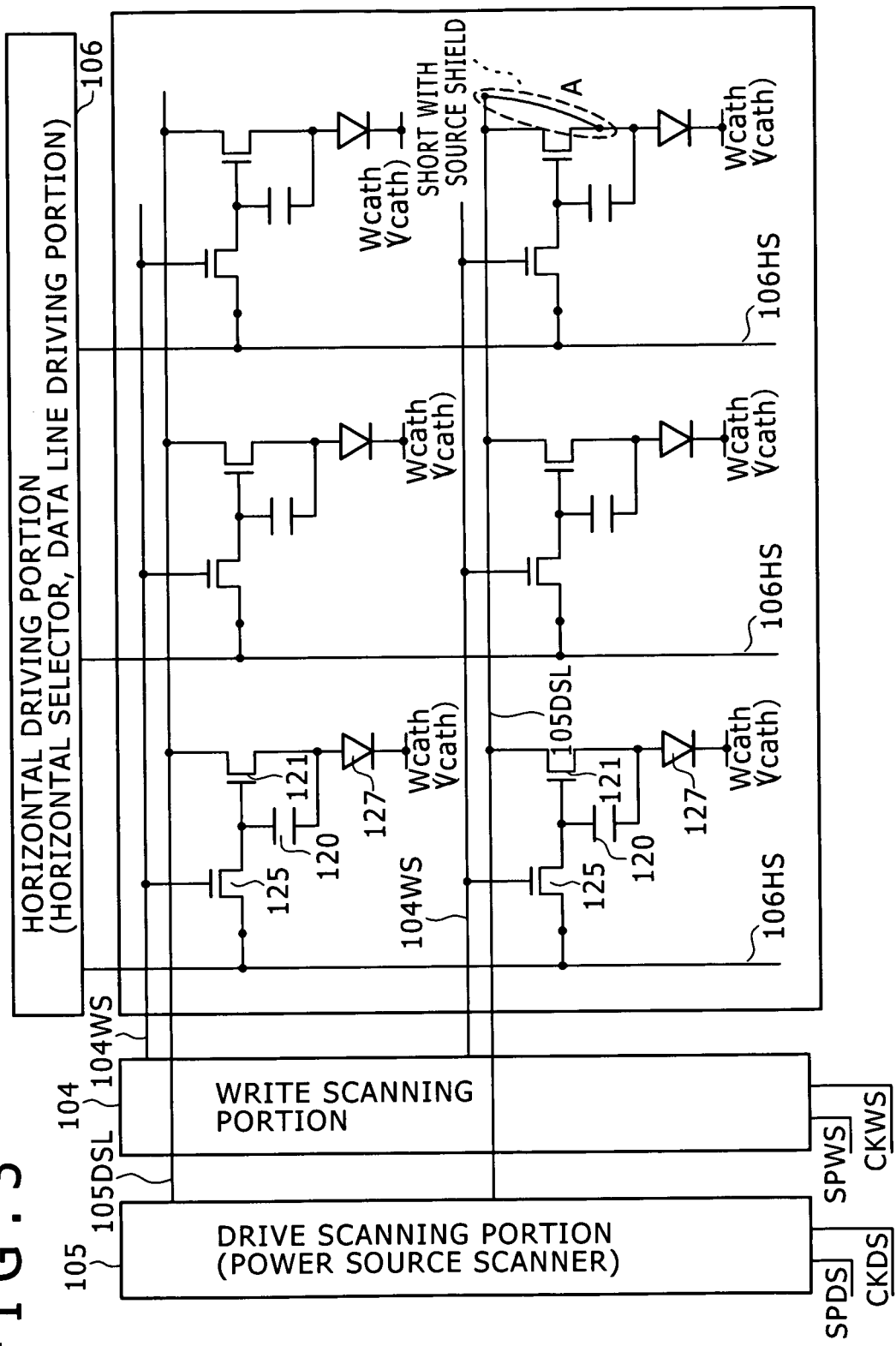

EVEN WHEN SOURCE SHIELD POWER SOURCE SHORT IS REPAIRED WITH LASER, POWER SOURCE SUPPLY IS POSSIBLE BECAUSE OF PRESENCE OF POWER SOURCE COMMON CONNECTION LINE 121DD_2

DISPLAY DEVICE WITH THRESHOLD CORRECTION

BACKGROUND OF THE INVENTION

1. Field of the Invention

The present invention relates to a display device including a current drive type electro-optic element (referred to as a display element or a light emitting element as well).

2. Description of the Related Art

There is known a display device using a current drive type electro-optic element a luminance of which changes in accordance with a current caused to flow through the current drive type electro-optic element as a display element for a pixel. For example, the current drive type electro-optic element is typified by an Organic Electro-Luminescence (EL) element such as an Organic Light Emitting Diode (OLED). An organic EL display device using an organic EL element is a so-called self emission type display device using an electro-optic element, as a self light emitting element, the display element for the pixel.

The organic EL element is the electro-optic element which includes an organic thin film (organic layer) obtained by laminating an organic hole transporting layer and an organic light emitting layer between a lower electrode and an upper electrode, and which utilizes a phenomenon that when application of an electric field across the organic thin film results in light emission. In this case, a chromogenic gradation is obtained by controlling a value of a current caused to flow the organic EL element.

The organic EL element consumes a less power because it can be driven with a relatively low applied voltage (for example, 10 V or less). In addition, the organic EL element is a self light emitting element which emits a light for itself. Thus, weight saving and thinning are readily carried out for the organic EL element because the organic EL element does not desire a subsidiary radiating member such as a backlight necessary for a liquid crystal display device. In addition thereto, since a response speed of the organic EL element is very high (for example, on the order of several microseconds), no residual image in a phase of display of a moving image occurs. From these advantages described above, in recent years, a planar self light emission type display device using the organic EL element as the electro-optic element has been actively developed.

In an organic EL display device using the current drive type element such as the organic EL element as the electro-optic element, a drive signal (voltage signal) corresponding to an input image signal written to a hold capacitor is converted into a current signal by a drive transistor, and the resulting drive current is supplied to the organic EL element or the like. With such a drive system, when a drive current value differs, an emission luminance differs so as to follow the drive current value. For this reason, in order to cause the organic EL element to emit a light at a stable luminance, it is important to supply a stable drive current to the electro-optic element. Therefore, in general, a constant current drive system is adopted. However, threshold voltages and mobilities of the drive transistors for driving the electro-optic elements disperse due to a change in process. In addition, the characteristics of the electro-optic element such as the organic EL element change with time. When there are the dispersion of the characteristics of the drive transistors, and the change in characteristics of the electro-optic element, even in the case of the constant drive system, an influence is exerted on the emission luminance.

For this reason, for the purpose of uniformly controlling the emission luminance over the entire picture on the display device, a mechanism for correcting a change in luminance due to the change in characteristics of the drive transistor or electro-optic element described above within the pixel circuits has been variously examined. Such a mechanism, for example, is described in Japanese Patent Laid-Open No. 2007-310311.

For example, with the mechanism described in Japanese Patent Laid-Open No. 2007-310311, there are proposed a threshold correcting function and a mobility correcting function of causing a drive current to be constant when there are the dispersion and the temporal change in threshold voltage, and mobilities of the drive transistors. Also, there is proposed a bootstrap function of causing the drive current to be constant even when there is a temporal change in current-voltage characteristics of an organic EL element.

SUMMARY OF THE INVENTION

In order to realize the threshold correcting function and the mobility correcting function, the technique described in Japanese Patent Laid-Open No. 2007-310311 adopts such a mechanism that a power source supply terminal (drain) side of a drive transistor is connected to a power source supply line as an example of vertical scanning lines, and a pulse-like power source voltage is supplied to the power source supply line, thereby carrying out vertical scanning. In the current light emission type element such as the organic EL element, it is necessary to cause the current to flow through the light emitting element. Therefore, normal light emission may not be obtained unless the power source supply terminal side of the drive transistor is properly connected to the power source supply line. However, connection abnormality is caused between the power source supply line and the power source supply terminal of the drive transistor due to a trouble in a process for manufacturing a transistor, and as a result, the proper light emission may not be obtained in some cases.

For example, a connection hole through which an extension line and a power source supply line extending from the power source supply terminal of the drive transistor is not opened due to a mistake in photolithography or etching in the process for manufacturing a transistor, so that the extension line and the power source supply line may not be connected to each other in some cases. In such cases, no power source voltage is applied to the drive transistor, and as a result, a vanishing point (point defect) is caused.

In addition, a short-circuit caused between the power source line, and a write scanning line, a video signal line or any other electrode member (for example, a source shield) due to interlayer short-circuit or isolayer short-circuit caused by a trouble, in the process for manufacturing a transistor, such as the mistake in the photolithography or the etching, or the dust in some cases. In the case of short-circuit caused between scanning lines, all the pixels belonging to one transverse line or one longitudinal line in which the short-circuit is caused do not normally emits lights, so that they become a line defect (a vanishing line or a luminescent line). When short-circuit is caused between the source shield of the drive transistor, and the power source supply line, the power source voltage is directly supplied to the organic EL element, so that the luminescent spot occurs. Various measure techniques are devised for the short-circuit caused between the scanning lines. However, when the same measure technique as that for the measures taken to cope with the short-circuit between the scanning lines is applied to the short-circuit caused between the source shield of the drive transistor, and the power source supply line, it may be impossible to solve the short-circuit caused between the source shield of the drive transistor, and the power source supply line. This is a drawback.

The present invention has been made in the light of the circumstances described above, and it is therefore desirable to provide a display device in which even when an abnormality occurs in connection between a power source supply line, and a power source supply terminal of a drive transistor due to a trouble in a process for manufacturing a transistor, an influence of abnormality occurrence is prevented from appearing in a display performance.

In order to attain the desire described above, according to an embodiment of the present invention, there is provided a display device including a pixel array portion having pixel circuits disposed in a matrix, each of the pixel circuits including a drive transistor for generating a drive current, and an electro-optic element connected to an output terminal of the drive transistor, and power source supply lines as scanning lines through which pulse-like power source voltages are supplied to power source supply terminals of the drive transistors, respectively, wired therein; in which power source contact portions through which the corresponding one of the power source supply terminals and the corresponding one of the power source supply lines are connected to each other are provided at predetermined distances from one another in a plurality of portions every drive transistor.

In a word, there is adopted a layout system in which the power source contact portions which the drive transistor can use are provided at the predetermined distances from one another in the plurality of portions.

When a plurality of power source contact portions which the drive transistor can use are provided at the predetermined distances from one another, even if a contact failure is caused in any of the portions, the connection between the corresponding one of the power source supply terminals and the corresponding one of the power source supply lines is maintained by the power source contact portions provided in other portions.

In addition, preferably, an extension wiring may be connected to the corresponding one of the power source supply terminals every drive transistor, the power source contact portions may be provided so that the extension wiring and the corresponding one of the power source supply lines are connected to each other through the power source contact portions, and the power source contact portions of the plurality of drive transistors may be connected to each other through a power source common line. As a result, even when a contact failure is caused in the power source contact portion on the side of one of the transistors, the connection between the corresponding one of the power source supply terminals and the corresponding one of the power source supply lines is maintained through the power source contact portions on the side of other drive transistor.

In addition, preferably, the power source common connection line may be wired in a portion located apart from the corresponding one of the power source supply lines within the corresponding one of the pixel circuits (that is, on the power source supply terminal side of the drive transistor). As a result, even when short-circuit is caused between the power source supply line and the source shield, the short-circuit state can be avoided by cutting the short-circuited portion with a laser beam or the like. At this time, although the connection between the power source supply line and the power source supply terminal of the drive transistor may be cut by the laser cutting or the like, the connection between the power source supply terminal and the power source supply line is maintained through the power source contact portion on the side of other drive transistor.

According to the embodiment of the present invention, it is possible to avoid the connection abnormality between the power source supply line, and the power source supply terminal of the drive transistor due to the trouble in the process for manufacturing a transistor. As a result, it is possible to remove the display defect caused by the connection abnormality. Therefore, the display device can be realized in high yields.

BRIEF DESCRIPTION OF THE DRAWINGS

FIG. 3 is a circuit diagram, partly in block, showing the pixel circuits for two rows and three columns in the active matrix type display device shown in FIG. 1;

DETAILED DESCRIPTION OF THE PREFERRED EMBODIMENTS

The preferred embodiments of the present invention will be described in detail hereinafter with reference to the accompanying drawings.

Entire Outline of Display Device

Figure 1:
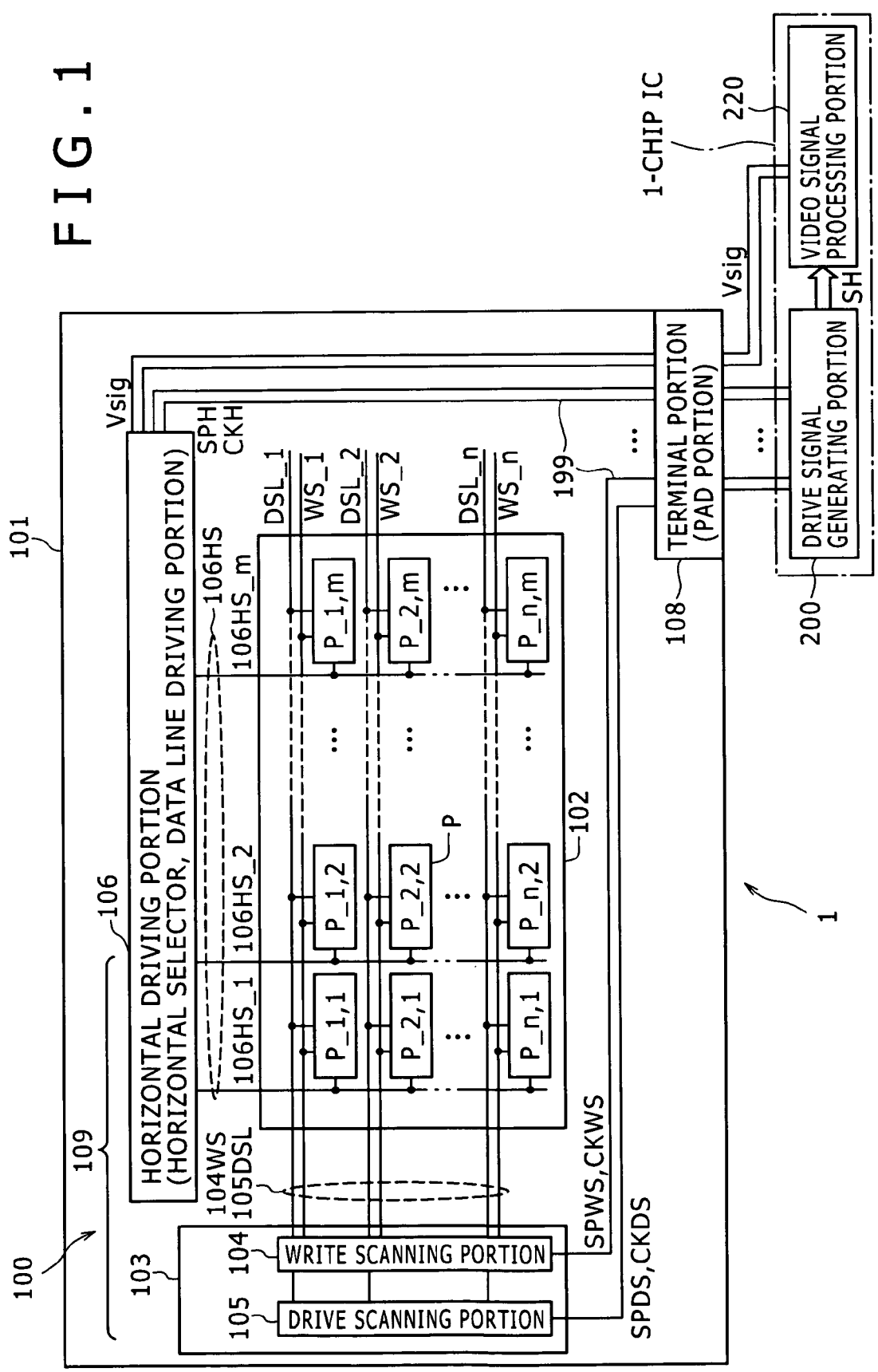
FIG. 1 is a block diagram showing a schematic configuration of an active matrix type display device according to an embodiment mode of the present invention.

FIG. 1 is a block diagram showing a schematic configuration of an active matrix type display device according to an embodiment mode of the present invention. In this embodiment mode, a description will now be given with respect to the case where the present invention is applied to an active matrix type organic EL display device (hereinafter referred to as "an organic EL display device" or simply referred to as "a display device" as well). In this case, the display device is configured as follows. That is to say, an organic EL element as a current drive type element is used as a display element (an electro-optic element or a light emitting element), and a polysilicon Thin Film Transistor (TFT) is used as an active element. Also, the organic EL element is formed on a semiconductor substrate having the TFT formed therein. A Field-effect Transistor (FET) is used as the TFT.

The display device 1 according to the embodiment mode of the present invention can be applied to display portions, of electronic apparatuses in all the field, in each of which a video signal inputted to the electronic apparatus, or a video signal generated in the electronic apparatus is displayed in the form of a still image or a moving image (video image). Here, these electronic apparatuses are typified by various electronic apparatuses such as a portable music player utilizing a recording medium such as a semiconductor memory, a mini-disc (MD) or a cassette tape, a digital camera, a notebook-size personal computer, mobile terminal equipment such as a mobile phone, and a video camera.

It is noted that although in the following description of the entire configuration, the concrete description is given by taking the organic EL element as the display element in the pixel as an example, this is merely an example, and thus the display element as an object is by no means limited to the organic EL element. All embodiments (especially, for measures taken to cope with a contact failure, and measures taken to cope with source shield short-circuit) which will be descried later can be similarly applied to all the electro-optic elements each of which generally emits a light in accordance with the current drive.

As shown in FIG. 1, the display device 1 includes a display panel portion 100, a drive signal generating portion (a so-called timing generator) 200, and a video signal processing portion 220. The display panel portion 100 includes a pixel array portion 102 as a main portion. In this case, pixel circuits (referred to as "pixels" as well) P having a plurality of organic EL element (not shown) as a plurality of display elements are disposed so as to compose an effective image area in which a ratio of a longitudinal length to a transverse length as a display aspect ratio is X:Y (for example, 9:16). The drive signal generating portion 200 is an example of a panel control portion for generating various pulse signals in accordance with which the display panel portion 100 is controlled so as to be driven. The drive signal generating portion 200 and the video signal processing portion 220 are built in one chip-semiconductor Integrated Circuit (IC). In this case, the drive signal generating portion 200 and the video signal processing portion 220 are disposed outside the display panel portion 100.

In the case of the configuration shown in FIG. 1, the pixel array portion 102 in which the pixel circuits P are arranged in a matrix of n×m is disposed on a substrate 101 of the display panel portion 100. In addition, a vertical driving portion 103 for vertically scanning the pixel circuits P, and a horizontal driving portion 106 (referred to as either "a horizontal selector" or "data line driving portion" as well) for horizontally scanning the pixel circuits P are mounted on the substrate 101. Moreover, a terminal portion 108 (pad portion) for external connection is disposed in an end portion of one side of the display panel portion 100. It is noted that an interface (IF) for interface between each of the vertical driving portion 103 and the horizontal driving portion 106, and an external circuit may be mounted on the substrate 101 as may be necessary.

The display panel portion 100, for example, includes a Write Scanner (WS) 104 and a Drive Scanner (DS) 105 functioning as a power source scanner having a power source supplying capability as the vertical driving portion 103. The pixel array portion 102, as an example, is driven from either one side or both sides in the horizontal direction illustrated by the write scanning portion 104 and the drive scanning portion 105, and is also driven from either one side or both sides in the vertical direction illustrated by the horizontal driving portion 106.

The vertical driving portion 103 (including the write scanning portion 104 and the drive scanning portion 105) and the horizontal driving portion 106 compose a control portion 109 for controlling an operation for writing a signal potential to a hold capacitor, a threshold correcting operation, a mobility correcting operation, and a bootstrap operation. Thus, the vertical driving portion 103 and the horizontal driving portion 106 function as a driving circuit for driving the pixel circuits P in the pixel array portion 102. As has been described, in the mounting state, peripheral driving circuits such as the vertical driving portion 103 and the horizontal driving portion 106 are mounted on the same substrate 101 as that of the pixel array portion 102.

Note that, the embodiment mode shown in FIG. 1 has the configuration that pulse signals are inputted from the outside of the display panel portion 100 to the display panel portion 100 through the terminal portion 108. However, it is also possible to adopt a configuration that the drive signal generating portion 200 for generating the various timing pulses is configured in the form of a semiconductor chip, and is mounted on the display panel portion 100.

The various pulse signals are supplied from the drive signal generating portion 200 disposed outside the display device 1 to the terminal portion 108. In addition, similarly, a video signal $V_{sig}$ is supplied from the video signal processing portion 220 to the terminal portion 108. In the case of a color display compliant device, video signals $V_{sig}$-R, $V_{sig}$-G, and $V_{sig}$-B corresponding to respective colors (Red (R), Green (G), and Blue (B) in this case) are supplied to the terminal portion 108.

As an example, necessary pulse signals such as shift start pulses SPDS and SPWS, and vertical scanning clock signals CKDS and CKWS (and vertical scanning clocks $_x$CKDS and $_x$CKWS obtained by inverting phases of the vertical scanning clocks CKDS and CKWS, respectively, as may be necessary) as an example of vertical write start pulses are supplied as the pulse signals for vertical driving to the terminal portion 108. In addition, necessary pulse signals such as a horizontal start pulse SPH and a horizontal scanning clock signal CKH (and a horizontal scanning clock signal $_x$CKH obtained by inverting a phase of the horizontal scanning clock signal CKH) as an example of a horizontal write start pulse are supplied as the pulse signal for horizontal scanning to the terminal portion 108.

Terminals of the terminal portion 108 are connected to the vertical driving portion 103 and the horizontal driving portion 106 through signal lines 199. For example, after the pulses supplied to the terminal portion 108 are internally adjusted in voltage levels thereof in a level shifter portion (not shown) as may be necessary, the resulting pulses are supplied to the portions, such as the write scanning portion 104 and the drive scanning portion 105, of the vertical driving portion 103 and the horizontal driving portion 106 through a buffer.

Scanning lines 104WS_1 to 104WS_n, and 105DSL_1 to 105DSL_n on the vertical scanning side, and video signal lines (data lines) 106HS_1 to 106HS_m as scanning lines on the horizontal scanning side are formed in the pixel array portion 102. An organic EL element (not shown) and a thin film transistor (not shown) for driving the organic EL element are formed in each of intersection portions between the scanning lines 104WS_1 to 104WS_n, and 105DSL_1 to 105DSL_n for the vertical scanning, and the scanning lines 106HS_1 to 106HS_m for the horizontal scanning. The pixel circuit P is configured by combining the organic EL element and the thin film transistor with each other.

Note that, a product form is by no means limited to the provision in the form of the display device 1 configured as a module (composed of composite components) form including all the display panel portion 100, the drive signal generating portion 200, and the video signal processing portion 220 as shown in FIG. 1. That is to say, for example, only the display panel portion 100 can be provided as the display device, or only the pixel array portion 102 can also be provided as the display device.

For example, the display device 1 includes a module shaped-portion having a sealed structure. For example, there is structured a display module composed of only a display panel portion 100 formed by being stuck to a counter portion such as a transparent glass of the pixel array portion 102. A display layer (an organic layer and electrode layers on both sides of the organic layer in this case), a color filter, a protective film, a light shielding film, and the like are provided on the transparent counter portion. In this case, in addition to the pixel array portion 102, electrical connection terminals becoming external connection terminals to a Flexible Printed Circuit (FPC) board are provided in a side edge of the display panel portion 100. Here, the FPC board is loaded with a circuit portion (a portion corresponding to the vertical driving portion 103 and the horizontal driving portion 106) for receiving as its inputs or outputting the video signal $V_{sig}$ and the various drive pulses from/to the outside. Other respects in this case are identical to those in the case of the configuration shown in FIG. 1.

Pixel Circuit

Figure 2:
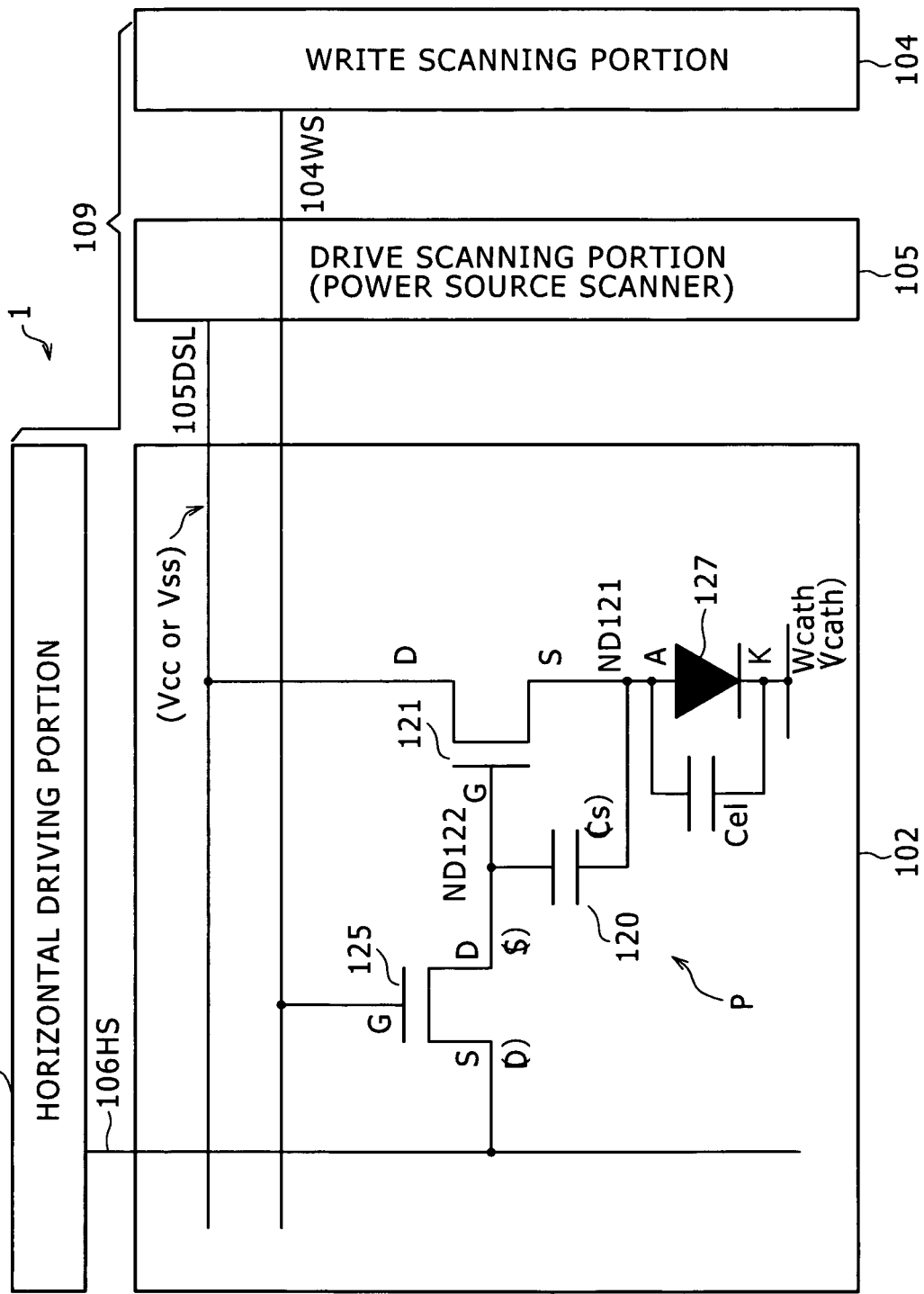
FIG. 2 is a circuit diagram, partly in block, showing a pixel circuit for one pixel in the active matrix type display device shown in FIG. 1.

FIGS. 2 and 3 are respectively a circuit diagram, partly in block, showing the pixel circuit P for one pixel, and a circuit diagram, partly in block, showing the pixel circuits P for two rows and three columns. In each of these figures, the vertical driving portion 103 and the horizontal driving portion 106 disposed in the peripheral portion of the pixel array portion 102 on the substrate 101 of the display panel portion 100 are shown together with each of the pixel circuit P for one pixel, and the pixel circuits P for two rows and three columns.

A MOS transistor (FET) is used as each of the drive transistor and other transistors. In this case, a gate terminal G of the drive transistor is treated as a control input terminal, one of a source terminal S and a drain terminal D of the drive transistor is treated as an input terminal, and the other thereof is treated as an output terminal. In addition, in particular, with regard to a drive transistor for supplying a drive current to the organic EL element 127, one of a source terminal S and a drain terminal D thereof (the source terminal S in this case) is treated as an output terminal, and the other thereof (the drain terminal D in this case) is treated as a power source supply terminal. Hereinafter, a pixel circuit P having a 2TR-configuration will be concretely described.

Since the organic EL element 127 is a current light emitting element, a chromogenic gradation is obtained by controlling a value of a current caused to flow through the organic EL element 127 in accordance with a video signal $V_{sig}$. The drive transistor is used for controlling the value of the current. In this case, the pixel circuit P of the embodiment mode adopts a configuration in which an N-channel FET is basically used as the drive transistor 121. In addition, the pixel circuit P of the embodiment mode includes a circuit for suppressing a change in drive current $I_{ds}$ to the organic EL element 127 due to temporal deterioration of the organic EL element 127, that is, a drive signal fixing circuit (part 1) for maintaining the drive current $I_{ds}$ constant by correcting a change in current-voltage characteristics of the organic EL element as an example of the electro-optic element.

In addition, there is adopted a drive system with which a threshold correcting function and a mobility correcting function for preventing a change in drive current $I_{ds}$ due to a change in characteristics of the drive transistor 121 (a dispersion of the threshold voltages, and a dispersion of mobilities), thereby maintaining the drive current $I_{ds}$ constant. With regard to a method of suppressing an influence exerted on the drive current $I_{ds}$ by the change in characteristics of the drive transistor 121 (for example, the dispersion or change in threshold voltage, mobility and the like), driving timings for the drive transistor 121 and the sampling transistor 125 are devised while the drive circuit having the 2TR-configuration is directly adopted as the drive signal fixing circuit (part 1), thereby taking the measures. High definition promotion is possible because the drive circuit has the 2TR drive-configuration, and the number of elements, and the number of wirings are less. In addition thereto, the excellent image quality can be obtained because the sampling can be carried out without deterioration of the video signal $V_{sig}$.

In addition, in the pixel circuit P in the display device 1 of the embodiment mode, the connection form of the hold capacitor 120 is devised. Thus, a bootstrap circuit as an example of the drive signal fixing circuit (part 2) is configured as a circuit for preventing a change in drive current $I_{ds}$ due to the temporal deterioration of the organic EL element 127. The pixel circuit P includes the drive signal fixing circuit (part 2) for realizing the bootstrap function for maintaining the drive current $I_{ds}$ constant (for preventing a change in drive current $I_{ds}$) even when there is a temporal change in current-voltage characteristics of the organic EL element 127.

Specifically, as shown in FIGS. 2 and 3, the pixel circuit P in the display device 1 of the embodiment mode includes the N-channel drive transistor 121, the N-channel sampling transistor 125, and the organic EL element 127 as the example of the electro-optic element which emits a light when a current is caused to flow therethrough. In general, the organic EL element 127 is expressed with a symbol of a diode because it has a rectifying property. It is noted that the organic EL element 127 has a parasitic capacitance $C_{el}$ parasitized therein. In FIG. 2, the parasitic capacitance $C_{el}$ is shown in the form of being connected in parallel with the organic EL element 127 (illustrated as the diode).

The hold capacitor 120 is connected between the source terminal S (a node ND 121) and the gate terminal G (a node ND 122) of the drive transistor 121, and the source terminal S of the drive transistor 121 is directly connected to the anode terminal of the organic EL element 127. The hold capacitor 120 functions as a bootstrap capacitor as well. In a word, the adoption of such a connection form results in the drive signal fixing circuit (part 2) realizing the bootstrap function is configured. A cathode terminal K of the organic EL element 127 is set at a cathode potential $V_{cath}$ as a reference potential. The cathode potential $V_{cath}$ is connected to a cathode wiring $W_{cath}$ (GND), common to all the pixels, for supplying the reference potential.

A gate terminal G of the sampling transistor 125 is connected to the write scanning line 104WS extending from the write scanning portion 104, a drain terminal D thereof is connected to the video signal line 106HS, and a source terminal S thereof is connected to the gate terminal G (the node ND122) of the drive transistor 121. A write drive pulse WS set at an active level H is supplied from the write scanning portion 104 to the gate terminal G of the sampling transistor 125. The sampling transistor 125 may also have a connection form obtained by interchanging the source terminal and the drain terminal with each other. In addition, any of a depletion type transistor and an enhance type transistor can be used as the sampling transistor 125.

The drain terminal D of the drive transistor 121 is connected to the power source supply line 105DSL extending from the drive scanning portion 105 serving as a power source scanner. The power source supply line 105DSL itself includes a power source supply capability for the drive transistor 121. Specifically, the drive scanning portion 105 includes a power source voltage switching circuit for switching a first potential $V_{cc}$ on a high voltage side, and a second potential $V_{ss}$ (referred to as "an initialization potential $V_{ini}$" as well) on a low voltage side which correspond to the power source voltages, respectively, and supplying the potential obtained through the switching to the drain terminal D of the drain transistor 121. The drain terminal side of the drive transistor 121 is driven by using a power source drive pulse DSL adapted to take two values of the first potential $V_{cc}$ and the second potential $V_{ss}$, thereby making it possible to carry out a repairing operation prior to threshold correction.

The second potential $V_{ss}$ is set at a potential sufficiently lower than an offset potential $V_{ofs}$ as a reference potential for the video signal $V_{sig}$ on the video signal line 106HS. Specifically, the second potential $V_{ss}$ on the low potential side of the power source supply line 105DSL is set so that a gate-to-source voltage $V_{gs}$ of the drive transistor 121 (a potential difference between a gate potential $V_g$ and a source potential $V_s$) is higher than a threshold voltage $V_{th}$ of the drive transistor 121. It is noted that the offset potential $V_{ofs}$ is utilized to previously pre-charge the video signal line 100HS as well as is utilized for the initializing operation prior to the threshold correcting operation.

In such a pixel circuit P, when the organic EL element 127 is driven, the first potential $V_{cc}$ is supplied to the drain terminal D of the drive transistor 121, and thus the source terminal S of the drive transistor 121 is connected to the anode terminal side of the organic EL element 127, thereby configuring a source follower circuit as a whole.

The 2TR drive-configuration using one switching transistor (the sampling transistor 125) for the scanning in addition to the drive transistor 121 is adopted, and ON/OFF timings for the power source drive pulse DSL and the write drive pulse WS in accordance with which the switching transistors are controlled are set. As a result, it is possible to prevent the influence exerted on the drive current Ids by the temporal deterioration of the organic EL element 127, and the change in characteristics of the drive transistor 121 (for example, the dispersion or change in threshold voltage, mobility and the like) (its details are described in Japanese Patent Laid-Open No. 2007-310311). It is possible to deal with the threshold correcting function and the mobility correcting function by devising the driving timings for the drive transistor 121 and the sampling transistor 125. Therefore, the high definition promotion is possible because the drive circuit has the 2TR drive-configuration, and the number of elements, and the number of wirings are both less. In addition thereto, the excellent image quality can be obtained because the sampling can be carried out without deterioration of the video signal $V_{sig}$.

Problematical Point

Here, with the drive system in the display device 1 of the embodiment mode, the pixel circuit P is driven by pulse-driving the power source supply line 105DSL. Thus, any of the power source lines is not common to all the pixels, and the individual pulses are inputted to the respective rows by using the power source supply lines 105DSL each being as an example of the vertical scanning lines. For this reason, not only the write scanning lines 104WS are transversely wired and the video signal lines 106HS are longitudinally wired, but also the power source supply lines 105DSL are also transversely wired (refer to FIG. 3). The drain terminals, as the power source supply terminals of the drive transistor 121, in the pixel circuits P, and the power source supply lines 105DSL are connected to each other through the extension wirings 121DL, respectively.

Here, no proper light emission is obtained when the connection abnormality occurs in the extension wiring 121DL between the power source supply line 105DSL and the drain terminal D of the drive transistor 121 due to the trouble in the process for manufacturing a transistor.

For example, the connection hole through which the extension wiring 121DL and the power source supply line 105DSL are intended to be connected is not opened due to the mistake or the like in the photolithography or the etching in the process for manufacturing a transistor, and as a result, the state in which the extension wiring 121DL and the power source supply line 105DSL may not be connected to each other in some cases. This problem will be referred hereinafter to as "a contact failure" as well. When such a contact failure occurs, no power source voltage is applied to the drive transistor 121, so that the vanishing point appears.

In addition, when the short-circuit is caused between the power source supply line 105DSL, and a source shield of the drive transistor 121 due to the mistake or the like in the photolithography or the etching in the process for manufacturing a transistor (refer to a portion A indicated by a circular dotted line in FIG. 3), the power source voltage is directly applied to the organic EL element 127, so that the luminescent spot appears. This problem will be referred hereinafter to as "a source shield power source short-circuit" as well. Even when laser repair is tried to be carried out for the short-circuited portion, the short-circuited portion may not be laser-repaired when another wiring layer exists in the short-circuited portion.

Next, a description will be given with respect to a mechanism of the embodiment mode for solving the various kinds of problems described above resulting from the trouble in the process for manufacturing a transistor.

First Embodiment

Figure 4A:
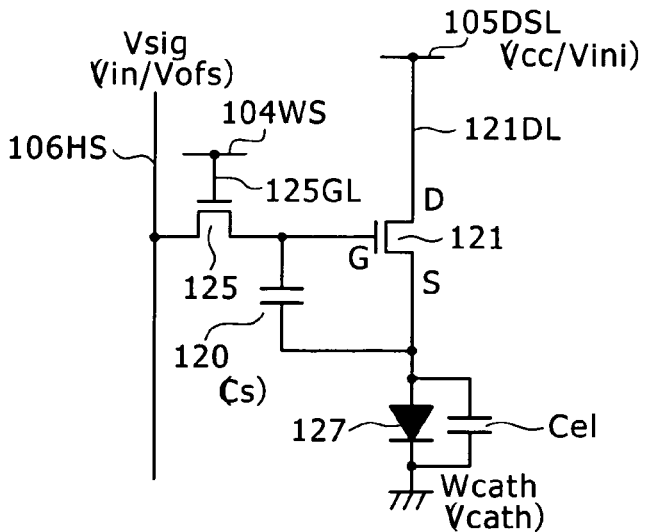
FIGS. 4A and 4B are respectively a circuit diagram of the pixel circuit for one pixel in the active matrix type display device shown in FIG. 1, and a top plan view of a layout for one pixel of a comparative example with the pixel circuit shown in FIG. 4A.
Figure 4B:
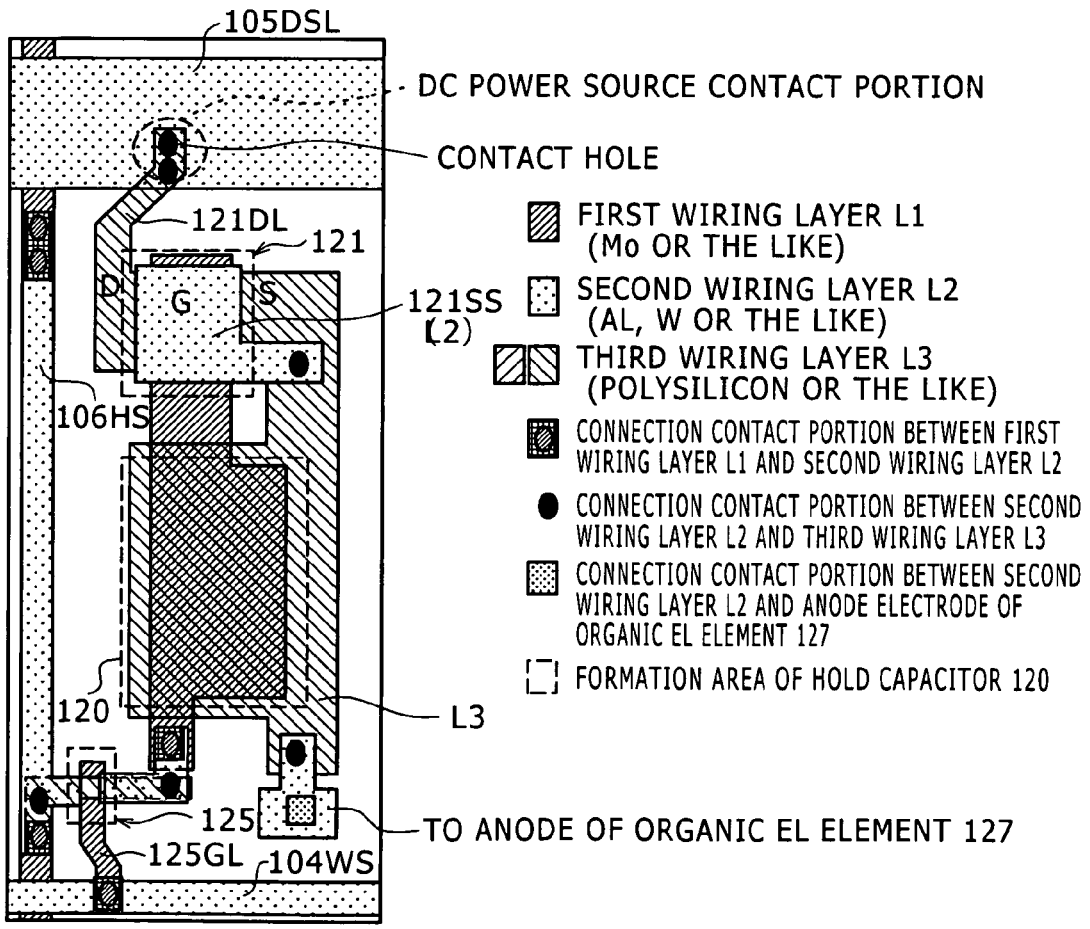
Figure 5:
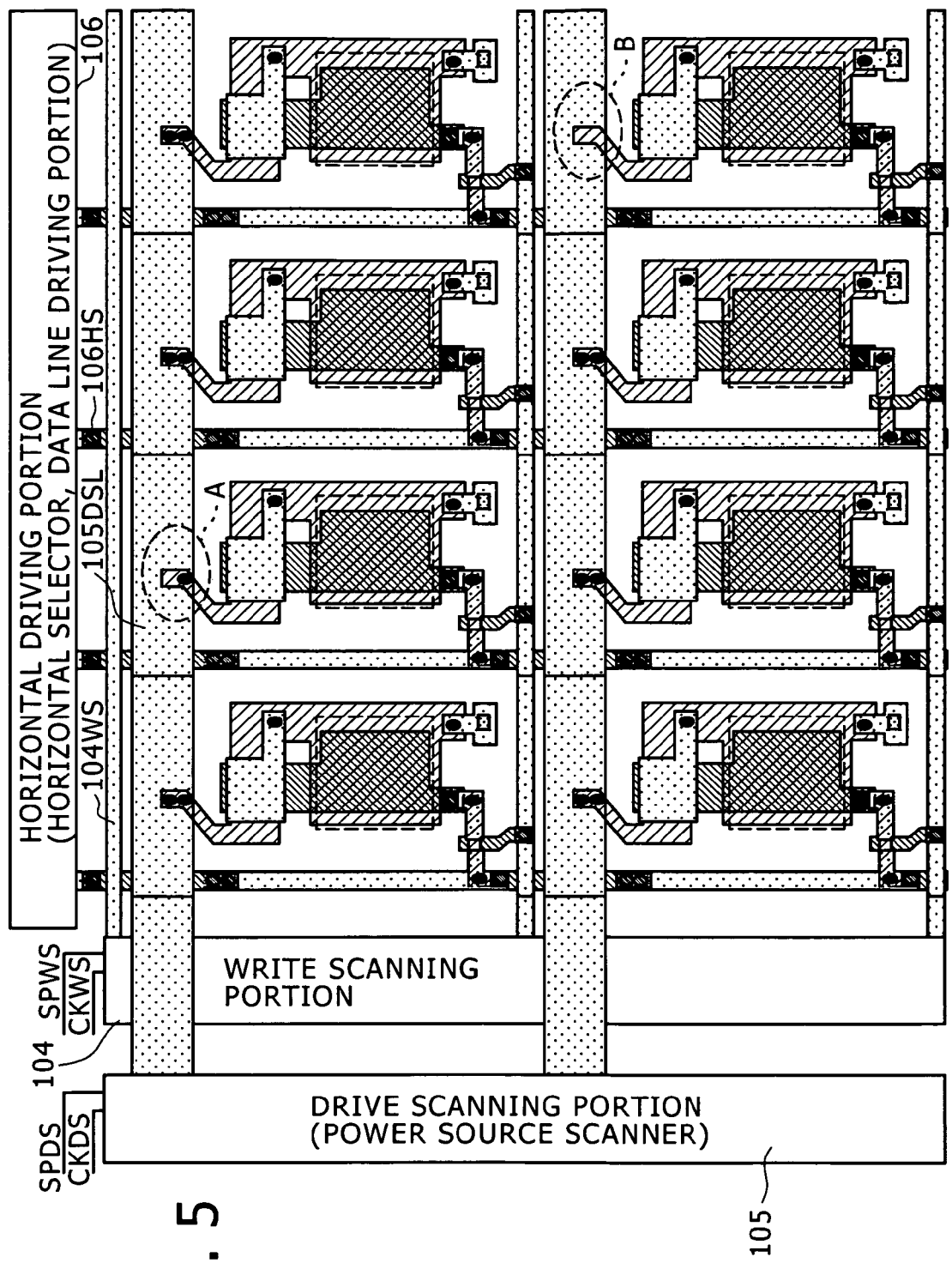
FIG. 5 is a top plan view showing a layout for two rows and four columns of the comparative example, to which the layout shown in FIG. 4B is applied, with the pixel circuit shown in FIG. 4A.
Figure 6:
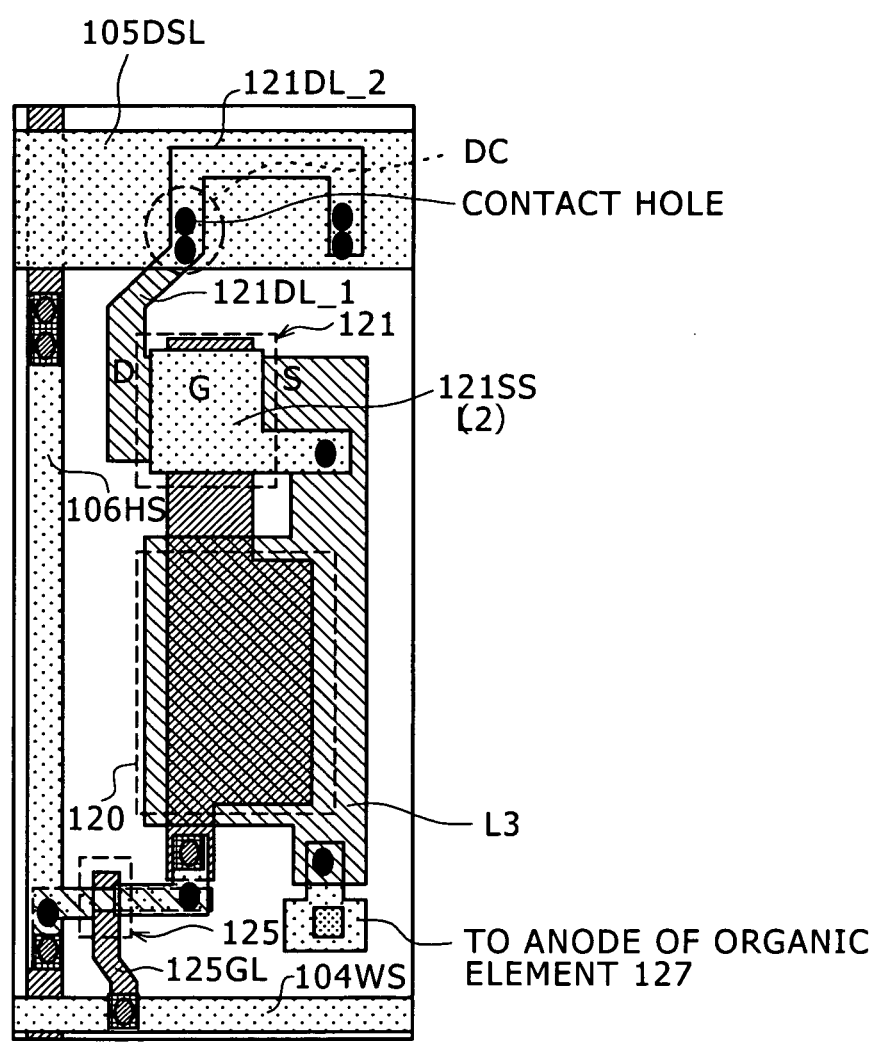
FIG. 6 is a top plan view showing a layout for one pixel of a first embodiment of the present invention.
Figure 7:
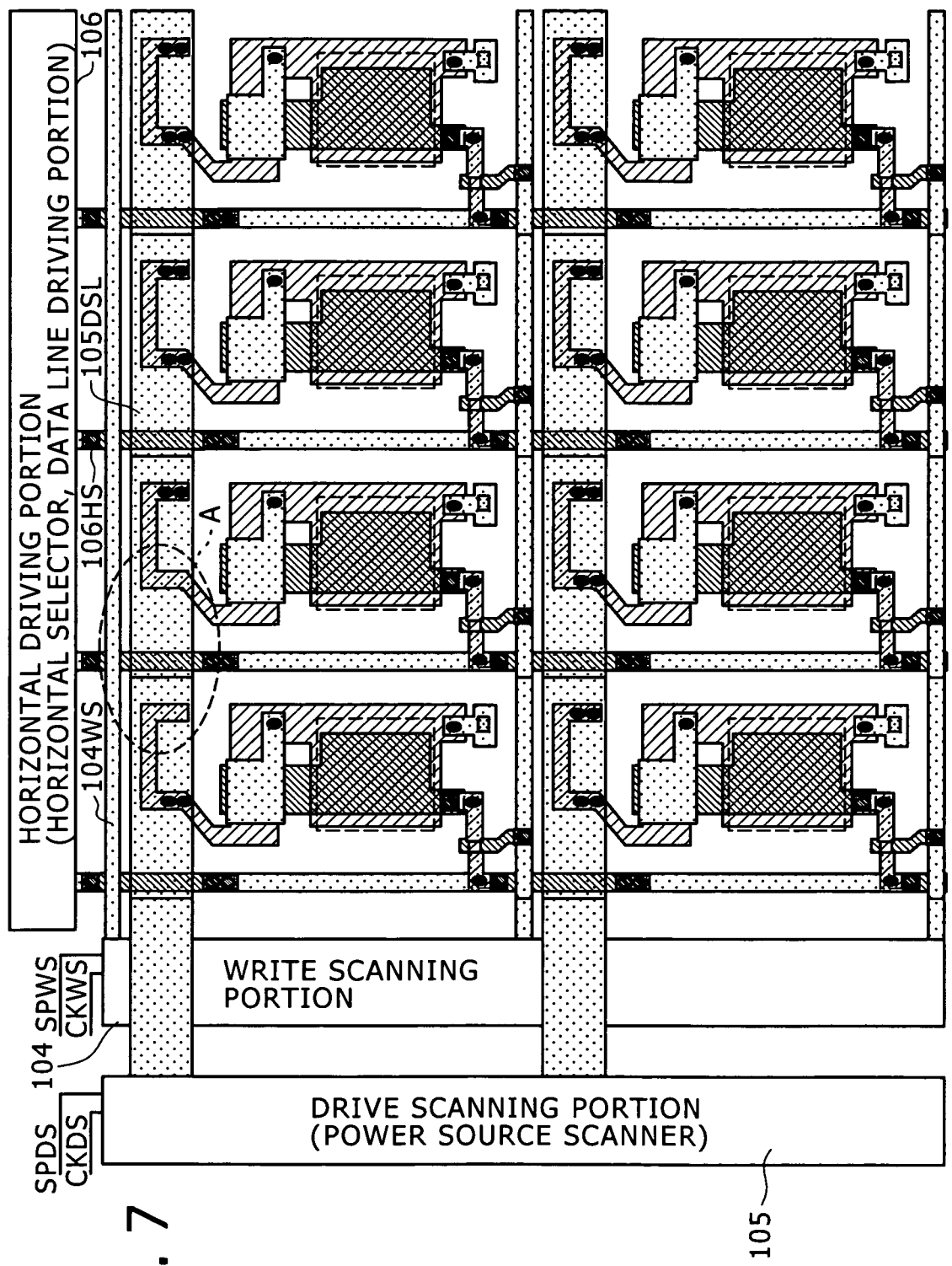
FIG. 7 is a top plan view showing a layout for two rows and four columns of the first embodiment of the present invention to which the layout shown in FIG. 6 is applied.

FIGS. 4A and 4B to FIG. 7 are respectively a circuit diagram and top plan views explaining a mechanism in a display device according to a first embodiment of the present invention. Here, FIG. 4A is the circuit diagram showing the pixel circuit P, FIG. 4B is the top plan view showing a layout for one pixel of a comparative example with the pixel circuit P shown in FIG. 4A, and FIG. 5 is the top plan view showing a layout for two rows and four columns of the comparative example to which the layout of the comparative example shown in FIG. 4B is applied. Also, FIG. 6 is the top plan view for one pixel in the display device of the first embodiment, and FIG. 7 is the top plan view for two rows and four columns in the pixel circuits in the display device of the first embodiment to which the layout shown in FIG. 6 is applied.

It is noted that the top plan views showing the respective layouts are the schematic views, including top plan views of other embodiments which will be described later, and are illustrated by giving the better viewing of the wiring relationship the priority, and the disposition order of the wiring layers does not necessarily match practical one in some cases. Basically, it is added that a first wiring layer L1 is disposed on the lowermost layer side, and a third wiring layer L3 and a second wiring layer L2 are disposed thereon in this order.

The mechanism in the display device of the first embodiment adopts measures, taken to cope with the contact failure, for improving the contact failure occurring between the power source supply line 105DSL and the extension wiring 121DL. For this reason, contact portions (hereinafter referred to as "power source contact portions DC") through which the extension wiring 121DL and the power source supply line 105DSL are connected to each other and which one drive transistor 121 can use are provided at distances from one another in a plurality of portions. That is to say, the power source contact portions DC which can be used every drive transistor 121 are provided at predetermined distances from one another in a plurality of portions. The number of contacts in each of the power source contact portions DC may be either one or two or more, and preferably may be two or more.

For example, in any of the comparative example and the first embodiment, the write scanning line 104WS, the power source supply line 105DSL and the video signal line 106HS are each made of aluminum, tungsten or the like in the second wiring layer L2 for the purpose of reducing the resistance values thereof. It is noted that the write scanning line 104WS, the power source supply line 105DSL and the video signal line 106HS are made to overlap one another in each of intersection portions with the write scanning lines by using the first wiring layer L1 made of molybdenum having a relatively large resistance value. In each of the comparative example and the first embodiment illustrated in the figures, in each of the intersection portions between the video signal line 106HS, and each of the write scanning line 104WS and the power source supply line 105DSL, the video signal line 106HS side is wired through the first wiring layer L1 once.

In addition, the extension wirings through the scanning lines and the transistor terminals are connected to each other, for example, are wired, by using the first wiring layer L1, the second wiring layer L2, or any other suitable wiring layer. For example, in each of the comparative example, and the first embodiment, the gate terminal G of the sampling transistor 125, and the write scanning line 104WS are connected to each other through the extension wiring 125GL (gate wiring) in the first wiring layer L1. In addition, the drain terminal D of the drive transistor 121, and the power source supply line 105DSL are connected to each other through the extension wiring 121DL of the third wiring layer L3 different from each of the first wiring layer L1 and the second wiring layer L2. A wiring member having a larger resistivity than that of the second wiring layer L2 is used as the third wiring layer L3. In a word, when the conditions of a width, a length, a thickness, and the like in the third wiring layer L3 are made identical to those in the second wiring layer L2, for example, the third wiring layer L3 is made as a polysilicon layer having a higher resistance value than that of the second wiring layer L2.

One electrode in the first wiring layer L1 connected to the gate terminal G of the drive transistor 121, and the other electrode in the third wiring layer L3 connected to the source terminal S of the drive transistor 121 are disposed so as to face each other with a relatively wide area, thereby forming the hold capacitor 120. For the drive transistor 121, a channel region (gate portion) is covered with a source shield 121SS utilizing the second wiring layer L2 connected to the source terminal S of the drive transistor 121, thereby taking the measures for the light shielding.

Here, with regard to the measures taken to cope with the contact failure, it is expected that the number of contacts in the power source contact portion DC is set as two or more as in the case of the comparative example shown in FIGS. 4B and 5. In the comparative example shown in FIGS. 4B and 5, the extension wiring 121DL from the drain terminal D of the drive transistor 121 is made to extend up to the power source supply line 105DSL, and two contact holes are formed in the power source contact portion DC. In this case, when one contact hole is not opened, but the connection is carried out through the other opened contact hole, the power source voltage is applied to the drive transistor 121, thereby making it possible to prevent occurrence of the vanishing point (refer to a portion A indicated by a circular dotted line in FIG. 5).

Moreover, actually, a probability that the mistake in the photolithography or the etching is caused over a certain range is high. For this reason, it was found out that a situation in which none of the contact holes is opened in a certain narrow range (referred to as "a mistake occurrence range") and finally all the contact holes are not opened occurs rather than the situation in which only one contact hole is not opened (refer to a portion B indicated by a circular dotted line in FIG. 5). In a word, the case of taking the measures for providing a plurality of contact holes in the power source contact portion DC is not enough to suppress the contact failure because all the plurality of contact holes may be provided within the mistake occurrence range.

On the other hand, in the case of a layout, of the pixel circuits A in the display device of the first embodiment, made for improving the contact failure, an extension wiring 121DL as the third wiring layer L3 belonging to the layer different from that of the power source supply line 105DSL in the second wiring layer L2 is made to extend. Also, a plurality of power source contact portions DC are provided at a distance from each other. In the example of the pixel circuit A in the display device of the first embodiment shown in FIGS. 6 and 7, an extension wiring 121DL_1 from the drain terminal D of the drive transistor 121 is made to extend up to the power source supply line 105DSL. Also, two contact holes are provided in a first power source contact portion DC. Moreover, an extension wiring 121DL_2 connected to the extension wiring 121DL is wired so as to be parallel with the power source line 105DSL. Also, two contact holes are provided in a second power source contact portion DC located at the predetermined distance apart from the first power source contact portion DC. Thus, the first embodiment adopts such a layout that an extra layout of the extension wiring 121DL_2 in the third wiring layer L3 is made in the lower portion of the power source supply line 105DSL in the second wiring layer L2, and the power source contact portions DC are provided at the distance from each other in a plurality of portions.

The extent to which the distance between each two power source contact portions DC is set is determined depending on the mistake occurrence range when the mistake in the photolithography or the etching occurs. A margin for the mistake occurrence range becomes large as the distance between each two power source contact portions DC is longer. Specifically, all that is desired is that all the power source contact portions DC in a plurality of portions are prevented from being provided within the mistake occurrence range. As a result, even when the mistake in the photolithography or the etching occurs, the power source contact portions DC in at least one portion exist outside the mistake occurrence range. Thus, the contact holes are approximately, reliably formed.

By adopting such a layout system, even when all the contact holes in a certain power source contact portion DC are not opened, the extension wiring 121DL and the power source supply line 105DSL are connected to each other through the contact hole in another power source contact portion DC located at some distance from the certain power source contact portion DC (refer to a portion A indicated by a circular dotted line in FIG. 7). In such a manner, even when the mistake in the photolithography or the etching occurs, the power source voltage is applied to the drive transistor 121 so long as a plurality of power source contact portions DC are provided apart from one another with the distance exceeding the mistake occurrence range being maintained. As a result, it is possible to prevent occurrence of the vanishing point. In addition, it is possible to prevent the contact failure caused between the power source supply line 105DSL and the drain terminal D (the extension wiring 121DL) of the drive transistor 121 by the photolithography mistake or the etching mistake causing the point defects. As a result, it is possible to reduce the number of point defects.

A facing area defined between the extension wiring 121DL in the third wiring layer L3, and the power source supply line 105DSL in the second wiring layer L2 is increased. Also, the power source contact portion DC between the power source supply line 105DSL and the extension wiring 121DL are provided in the portions away from one another. As a result, even when the contact failure is caused, the drain voltage can be applied to the drive transistor 121, and thus it is possible to suppress the occurrence of the vanishing point. Also, the contact margin can be increased, thereby making it possible to prevent the occurrence of the display defect (point defect) due to the contact failure caused by the photolithography mistake or the etching mistake causing the point defect. As a result, the high yield can be realized.

Second Embodiment

Figure 8:
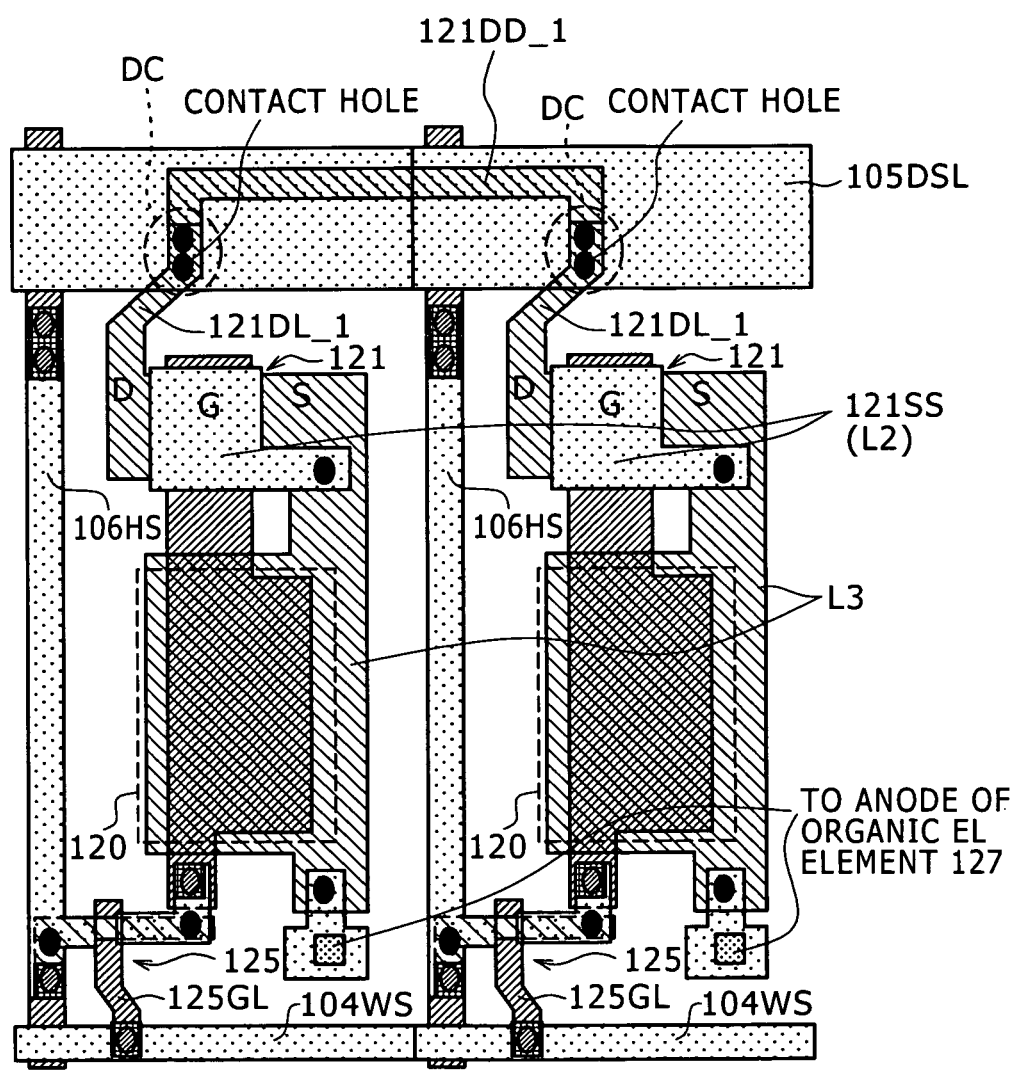
FIG. 8 is a top plan view showing a layout for two pixels according to a first example of a second embodiment of the present invention.
Figure 9:
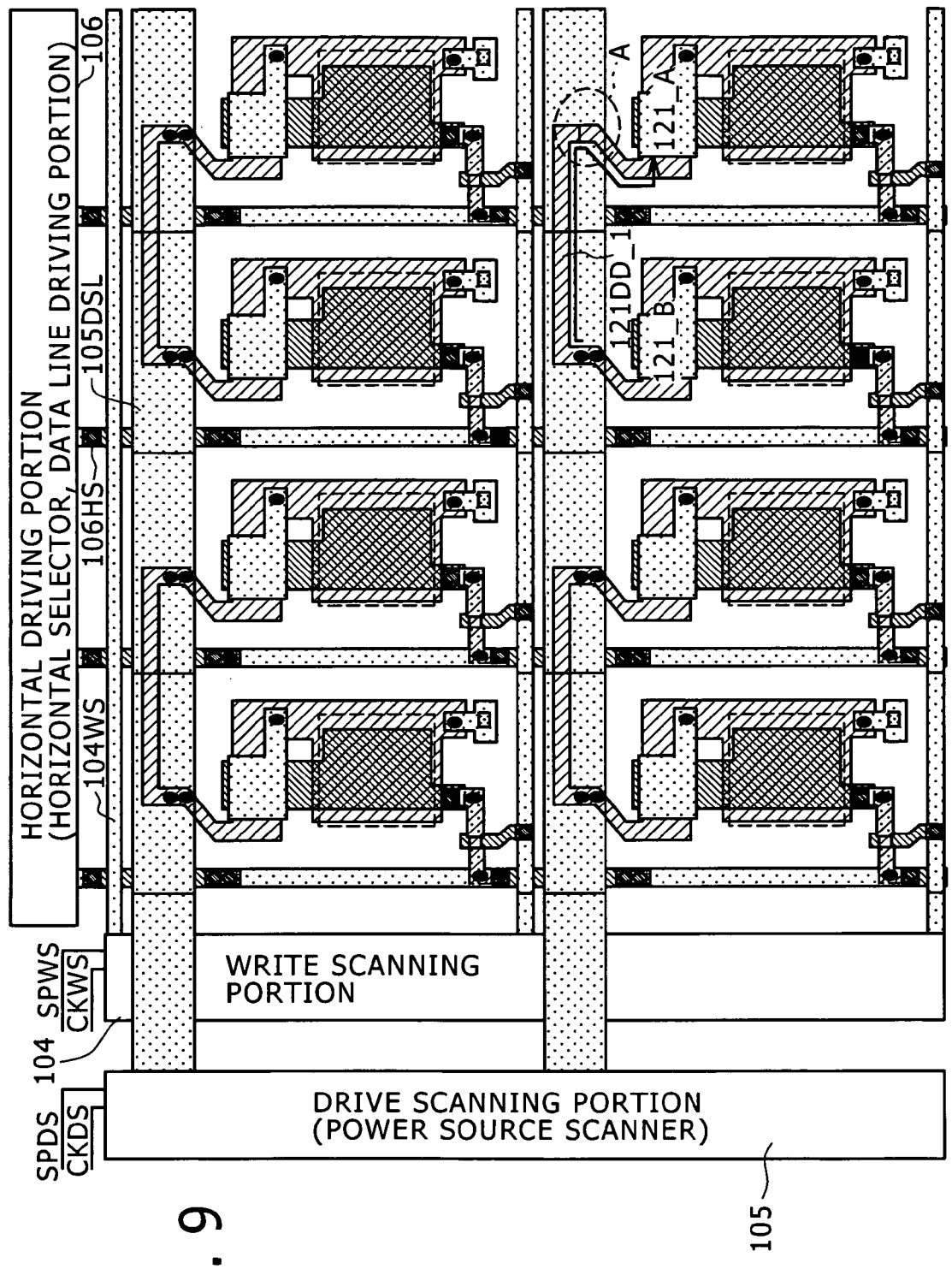
FIG. 9 is a top plan view showing a layout for two rows and four columns according to the first example of the second embodiment to which the layout shown in FIG. 8 is applied.
Figure 10:
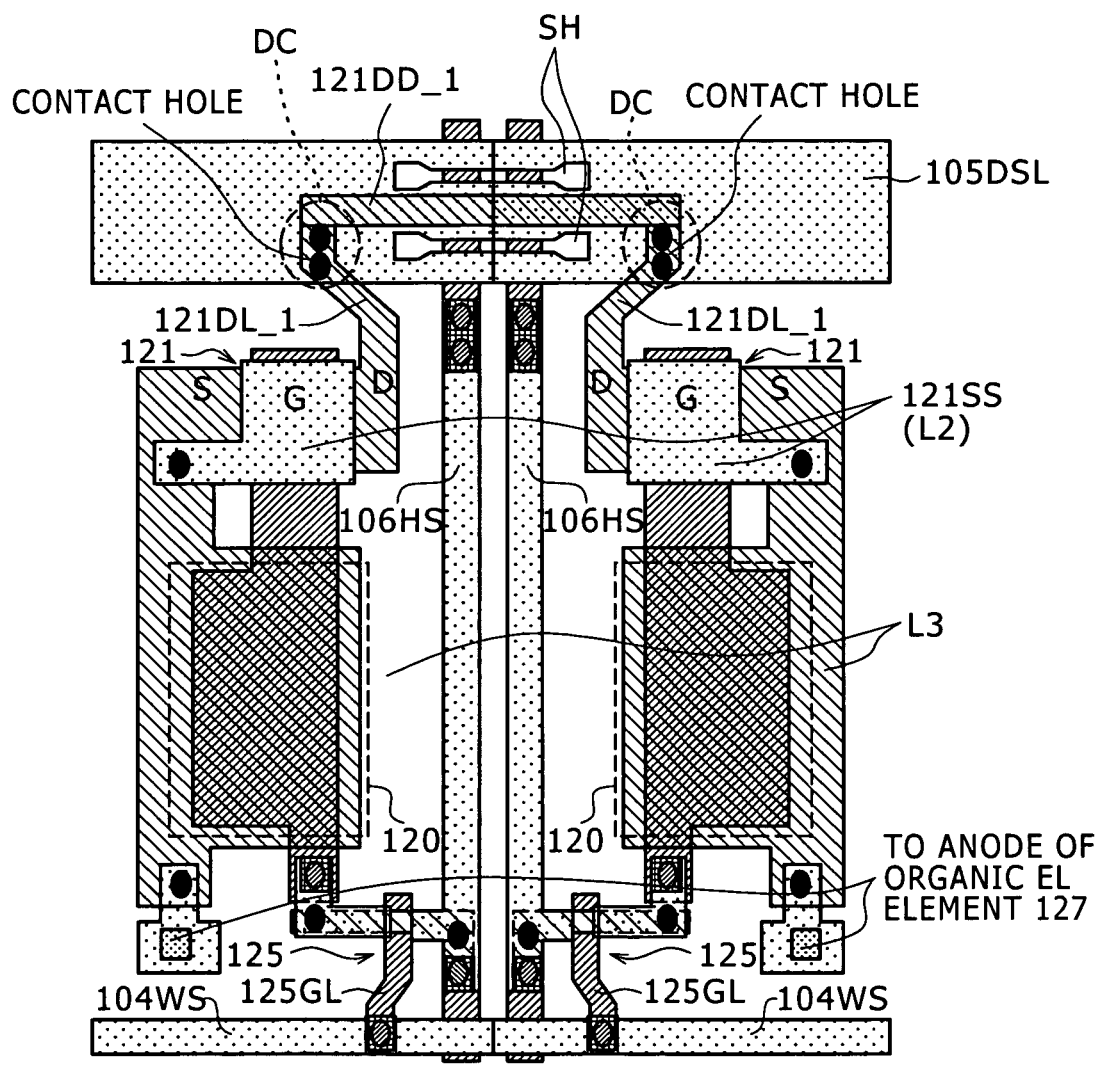
FIG. 10 is a top plan view showing a layout for two pixels according to a second example of the second embodiment of the present invention.
Figure 11:
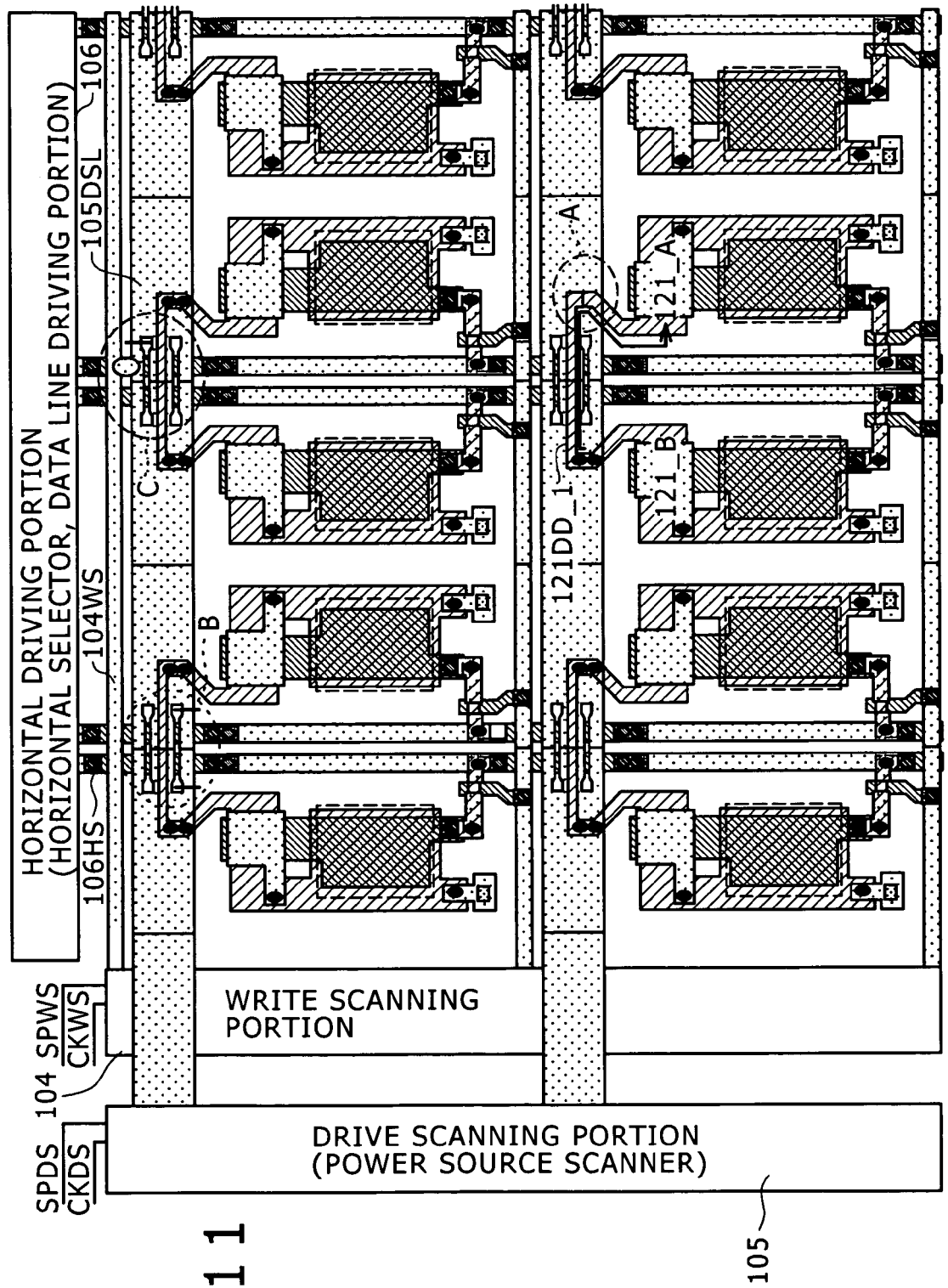
FIG. 11 is a top plan view showing a layout for two rows and five columns according to the second example of the second embodiment to which the layout shown in FIG. 10 is applied.
Figure 12:
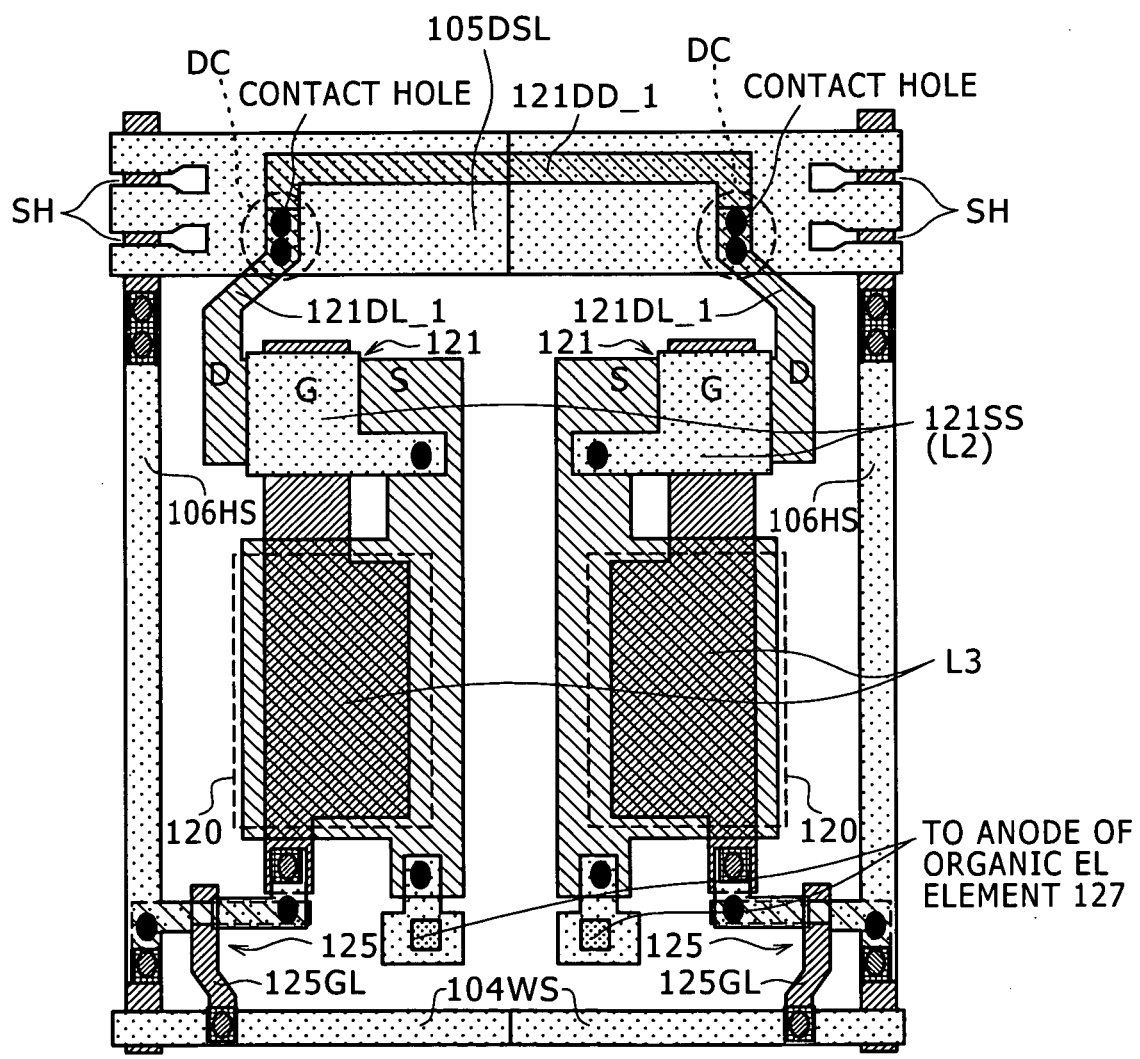
FIG. 12 is a top plan view showing a layout for two pixels according to a third example of the second embodiment of the present invention.
Figure 13:
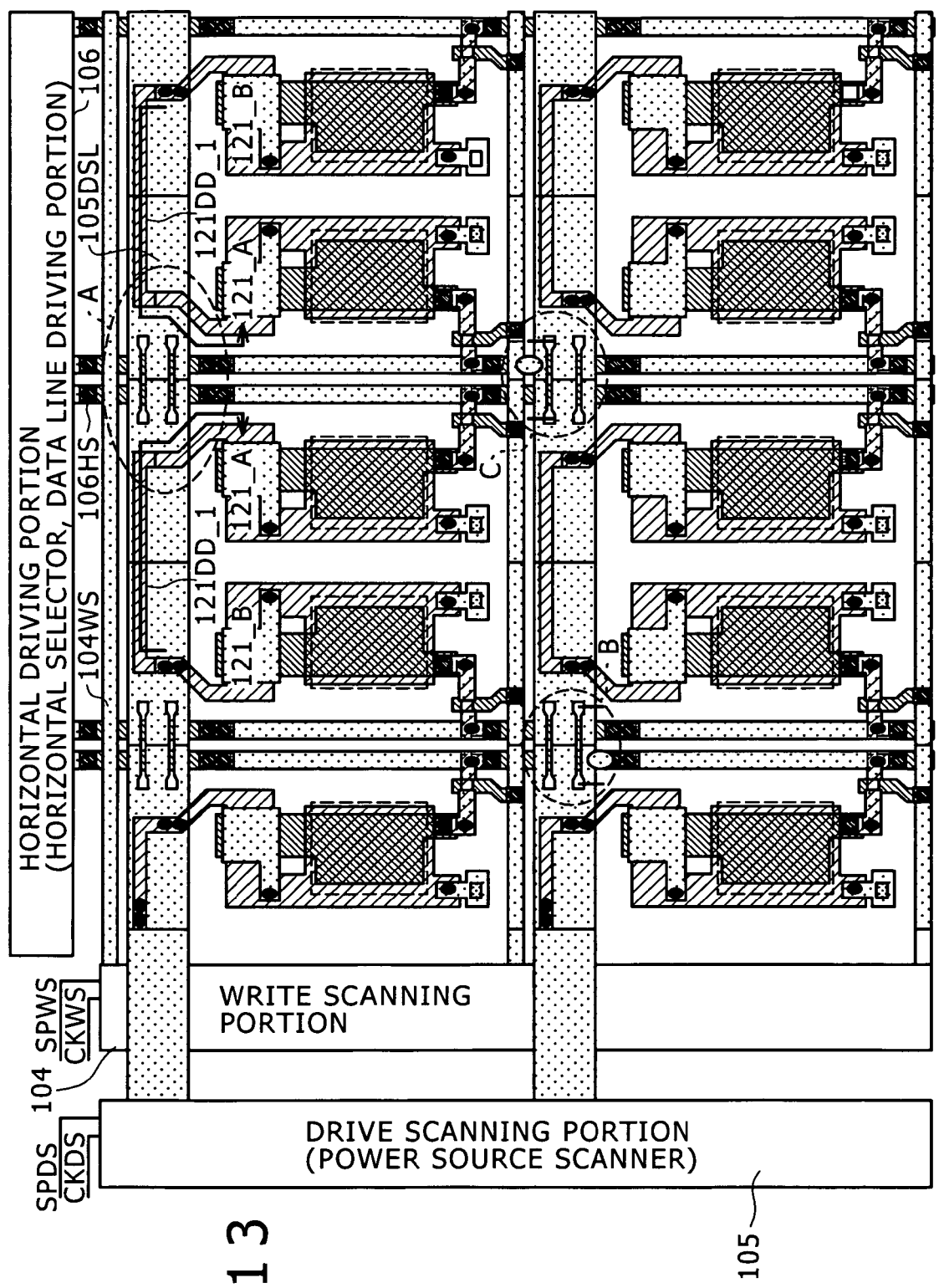
FIG. 13 is a top plan view showing a layout for two rows and five columns according to the third example of the second embodiment to which the layout shown in FIG. 12 is applied.
Figure 14A:
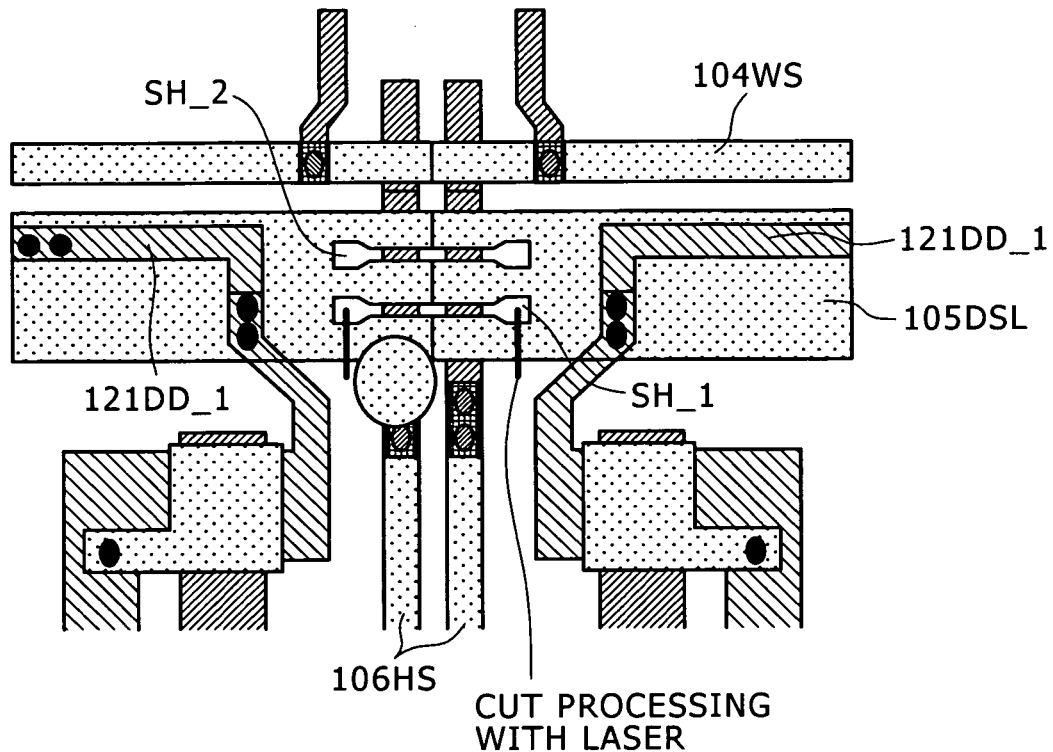
FIGS. 14A and 14B are respectively top plan views explaining an additional effect of the second embodiment.
Figure 14B:
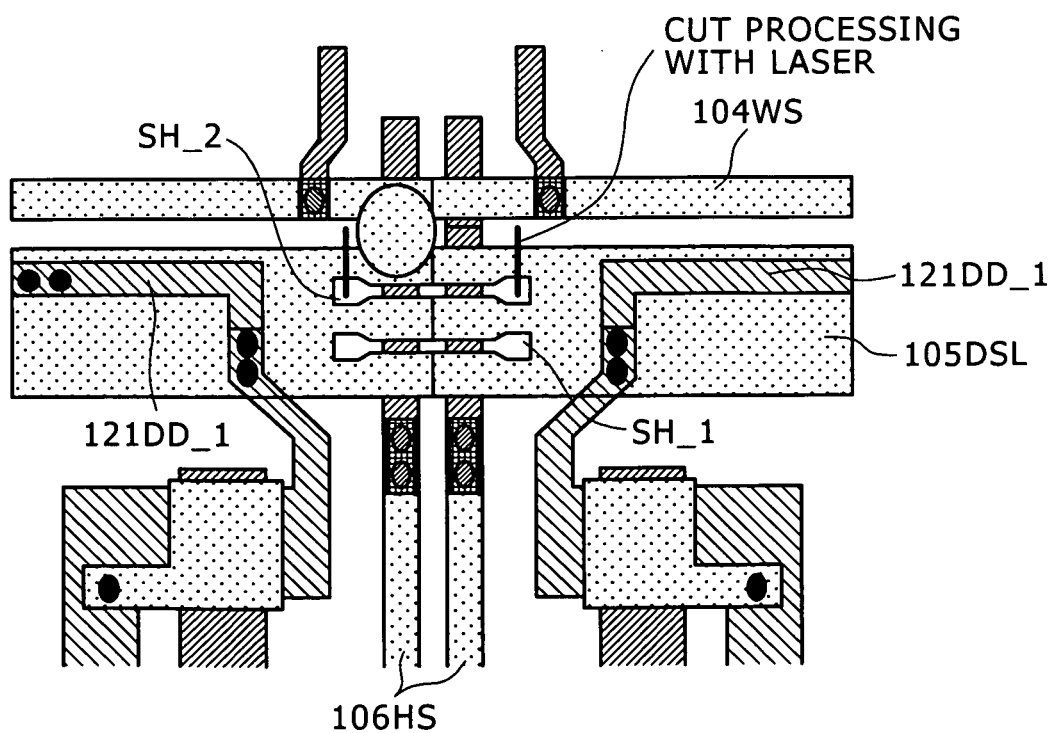

FIG. 8 to FIGS. 14A and 14B are respectively top plan views explaining a mechanism in pixel circuits P in a display device according to a second embodiment of the present invention. Here, FIG. 8 is a top plan view showing a layout for two pixels according to a first example of the second embodiment, and FIG. 9 is a top plan view showing a layout for two rows and four columns according to the first example of the second embodiment to which the layout shown in FIG. 8 is applied. FIG. 10 is a top plan view showing a layout for two pixels according to a second example of the second embodiment, and FIG. 11 is a top plan view showing a layout for two rows and five columns according to the second example of the second embodiment to which the layout shown in FIG. 10 is applied. Also, FIG. 12 is a top plan view showing a layout for two pixels according to a third example of the second embodiment, and FIG. 13 is a top plan view showing a layout for two rows and five columns according to the third example of the second embodiment to which the layout shown in FIG. 12 is applied. Also, FIGS. 14A and 14B are respectively top plan views explaining an additional effect of the second embodiment.

A mechanism of the second embodiment is similar to that of the first embodiment in that the power source contact portions DC which one drive transistor 121 can use are provided at distances from one another in a plurality of portions, thereby improving the contact failure caused between the power source supply line 105DSL and the extension wiring 121DL. The second embodiment is different from the first embodiment in that the extension wirings 121DL of a plurality of pixel circuits P are commonly connected to one another through a power source common connection line 121DD_1 wired in parallel with the power source supply line 105DSL. The power source contact portion DC with the extension wiring 121DL for one drive transistor 121 is commonly used as the power source contact portion DC as well for another drive transistor 121 through the common connection. As a result, the structure is realized in which the power source contact portions DC which one drive transistor 121 can use are factually provided at predetermined distances in a plurality of portions. A point of difference between the first example, and each of the second and third examples is whether or not a layout of one pixel circuit P of two pixel circuits P adjacent to each other in the same row is mirror-inverted (whether or not the layouts of the two adjacent pixel circuits P exhibit a mirror inversion relationship). A combination of the adjacent two pixel circuits P the extension wirings 121DL of which are commonly connected to each other and the layouts of which exhibit the mirror inversion relationship is different between the second example and the third example.

So long as the drains of a plurality of drive transistors 121 are commonly connected to one another through the power source common connection line 121DD_1, an object of the configuration may be the pixel circuit P in any position. When the easiness of the wiring is taken into consideration, it is better to carry out the common connection between the near (especially, preferably, the adjacent) adjacent pixel circuits P. Note that, the second embodiment is similar to a third embodiment which will be described later in that the extension wirings 121DL of a plurality of pixel circuits P are commonly connected to one another. However, the second embodiment is different from the third embodiment in that the wiring (referred to as "the power source common connection line 121DD_1") through which the extension wirings 121DL of a plurality of pixel circuits P are commonly connected to one another is wired in parallel with the power source supply line 105DSL similarly to the case of the first embodiment.

For example, each of the first and second examples of the second embodiment adopts a combination layout system that for the adjacent two pixel circuits P, the power source common connection line 121DD_1 for common connection intersects with the video signal line 106HS for the corresponding pixel circuits P. On the other hand, the third example of the second embodiment adopts a combination layout system that for the adjacent two pixel circuits P exhibiting the mirror inversion relationship, the power source common connection line 121DD_1 for common connection does not intersect with the video signal line 106HS for the corresponding pixel circuits P. The second example of the second embodiment exhibits the mirror inversion relationship in combination in which the length of the power source common connection line 121DD_1 becomes short. On the other hand, the third example of the second embodiment exhibits the mirror inversion relationship in combination in which the length of the power source common connection line 121DD_1 becomes long.

Any of the first to third examples of the second embodiment adopts the layout system that the extension wirings 121DL of the pixel circuits P as the object of the combination are connected to each other through the power source common connection line 121DD_1 disposed below the power source supply line 105DSL in parallel with the power source supply line 105DSL. Even when the power source supply line 105DSL and the extension wiring 121DL may not be connected to each other because none of the contact holes is opened in the power source contact portion DC of the extension wiring 121DL of one side (the drive transistor 121_A) of the two drive transistors 121 (refer to a portions A shown in each of FIGS. 9, 11 and 13), the power source supply line 105DSL and the drain terminal D of the drive transistor 121_A are connected to each other in the power source contact portion DC of the extension wiring 121DL on the other drive transistor 121_B side adjacent to the one drive transistor 121_A side through the power source common connection line 121DD_1. As a result, even when the contact failure is caused, the drain voltage can be applied to the drive transistor 121_A, thereby making it possible to suppress the occurrence of the vanishing point. Also, the contact margin can be increased, thereby making it possible to prevent the occurrence of the display defect (point defect) due to the contact failure caused by the photolithography mistake or the etching mistake causing the point defect. As a result, the high yield can be realized.

Here, comparing the first to third examples of the second embodiment with one another, the length of the power source common connection line 121DD_1 for common connection, that is, the distance between the power source contact portions DC for the adjacent two pixel circuits P is longer in the first example having no mirror disposition than in the second example having the mirror disposition. Also, that distance is longer in the third example than in each of the first and second examples. Therefore, in the case of the layouts of the first to third examples of the pixel circuits P shown herein, the third example is more preferable than the second example in terms of the form of the mirror disposition.

The reason for this, as can be seen from the description of the first embodiment, is based on that all the power source contact portions DC of the adjacent two pixels P are prevented from being provided within the mistake occurrence range. In a word, the reason for this is because if all the power source contact portions DC for the adjacent pixel circuits P are provided within the mistake occurrence range even when the extension wirings 121DL are commonly connected to each other through the power source common connection line 121DD_1, the extension wirings 121DL and the power source supply line 105DSL may not be connected to each other, so that both the adjacent two pixels become the vanishing points. When the first to third examples are compared with one another from a viewpoint of the measures taken to cope with the contact failure caused between the extension wiring 121DL and the power source supply line 105DSL, the third example having the longest distance between the adjacent two power source contact portions DC is optimal, followed by the first example and the second example. The reason for this is because it is important to prevent all the power source contact portions DC for the adjacent two pixel circuits P from being provided within the mistake occurrence range.

In short, in the case of application of the second embodiment, it is preferable that no matter how the layouts of the pixel circuits P are made, the combination allowing the distance between the power source contact portions DC for the adjacent two pixel circuits P to become long is selected as the combination of the mirror disposition, and thus the extension wirings 121DL from the drain terminals D of the drive transistors 121 are commonly connected to each other through the power source common connection line 121DD_1. As a result, even when the mistake in the photolithography or the etching occurs, at least one power source contact portion DC exists outside the mistake occurrence range, and thus the contact hole is approximately, reliably formed. Also, the power source voltage can be supplied to the drive transistor side having no contact hole formed therein through that contact hole and the extension wiring 121DL for common connection.

In addition, the third example adopts the combination in which the power source common connection line 121DD_1 does not intersect with the video signal line 106HS for the pixel circuits P. Therefore, there is also an advantage that slit holes SH for the measures taken to cope with the inter-scanning line short-circuit are readily provided in parallel with each other in the intersection portion between the video signal line 106HS for the corresponding pixel circuits P and the power source supply line 105DSL. Even in the case of each of the first and second examples, it may not be impossible to provide the slit hole SH (for example, refer to the second example). However, it is necessary to wire the power source common connection line 121DD_1 between the slit holes SH disposed in parallel with each other. From this, the easiness of formation of the power source common connection line 121DD_1 and the slit hole SH is higher in the third example than in each of the first and second examples.

The vanishing line occurs when the short-circuit is caused between the power source supply line 105DSL and the write scanning line 104WS (refer to a portion B in each of FIGS. 11 and 13) due to the isolayer short-circuit or the interlayer short-circuit owing to the dust resulting from the mistake in the photolithography or the etching in the process for manufacturing a transistor. Also, the luminescent line and the vanishing line occur, and so forth when the short-circuit is caused between the power supply line 105DSL and the video signal line 106HS (refer to a portion C in each of FIGS. 11 and 13). As a result, the line defect appears due to occurrence of the luminescent line and the vanishing line.

With regard to the measures taken to cope with the short-circuit caused between the scanning lines, for example, the slit hole SH is bored in an intersection portion between the power source supply line 105DSL and another wiring (the video signal line 106HS in this case). Also, the longitudinal sides of the power source supply lines 105DSL in the both ends of the slit portion are cut by utilizing the slit portion, thereby repairing the isolayer short-circuit caused in the vicinity of the slit hole SH. In this case, the laser repairing in which a laser beam is utilized in the cut processing can be applied.

For example, in order to cope with the short-circuit in the portion B shown in each of FIGS. 11 and 13, as shown in FIG. 14A, cuts (indicated by heavy solid lines in the figure) are made in the longitudinal sides on the power source supply line 105DSL on the video signal line 106HS sides on the both sides of a slit hole SH_1 side. Also, the longitudinal sides are separated by the slit hole SH_1 and the cuts made by the laser beam. On the other hand, in order to cope with the short-circuit caused in a portion C shown in each of FIGS. 11 and 13, as shown in FIG. 14B, cuts (indicated by heavy solid lines in the figure) are made in the longitudinal sides of the power source supply line 105DSL on the write scanning line 104WS side on the both sides of a slit hole SH_2 side. Also, the longitudinal sides are separated by the slit hole SH_2 and the cuts made by the laser beam.

Third Embodiment

Figure 15:
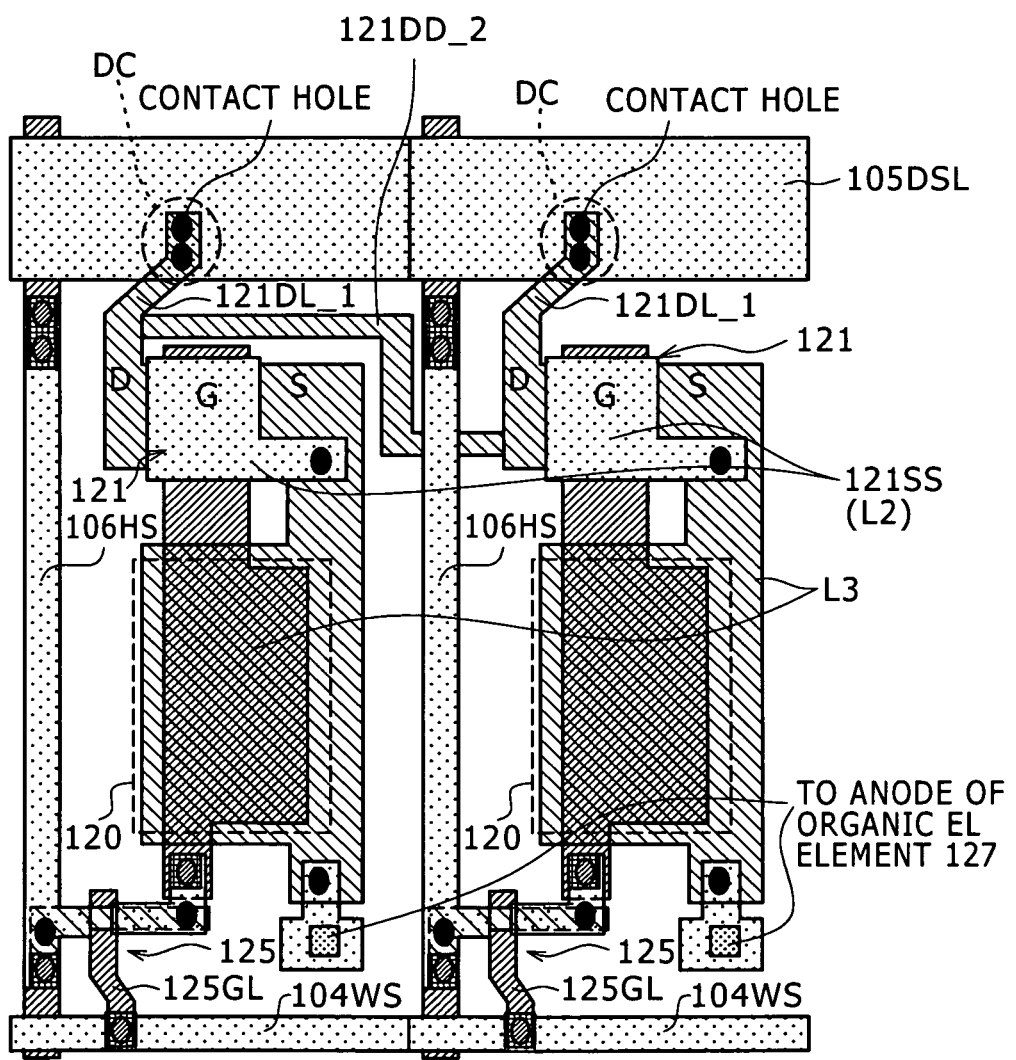
FIG. 15 is a top plan view showing a layout for two pixels according to a first example of a third embodiment of the present invention.
Figure 16:
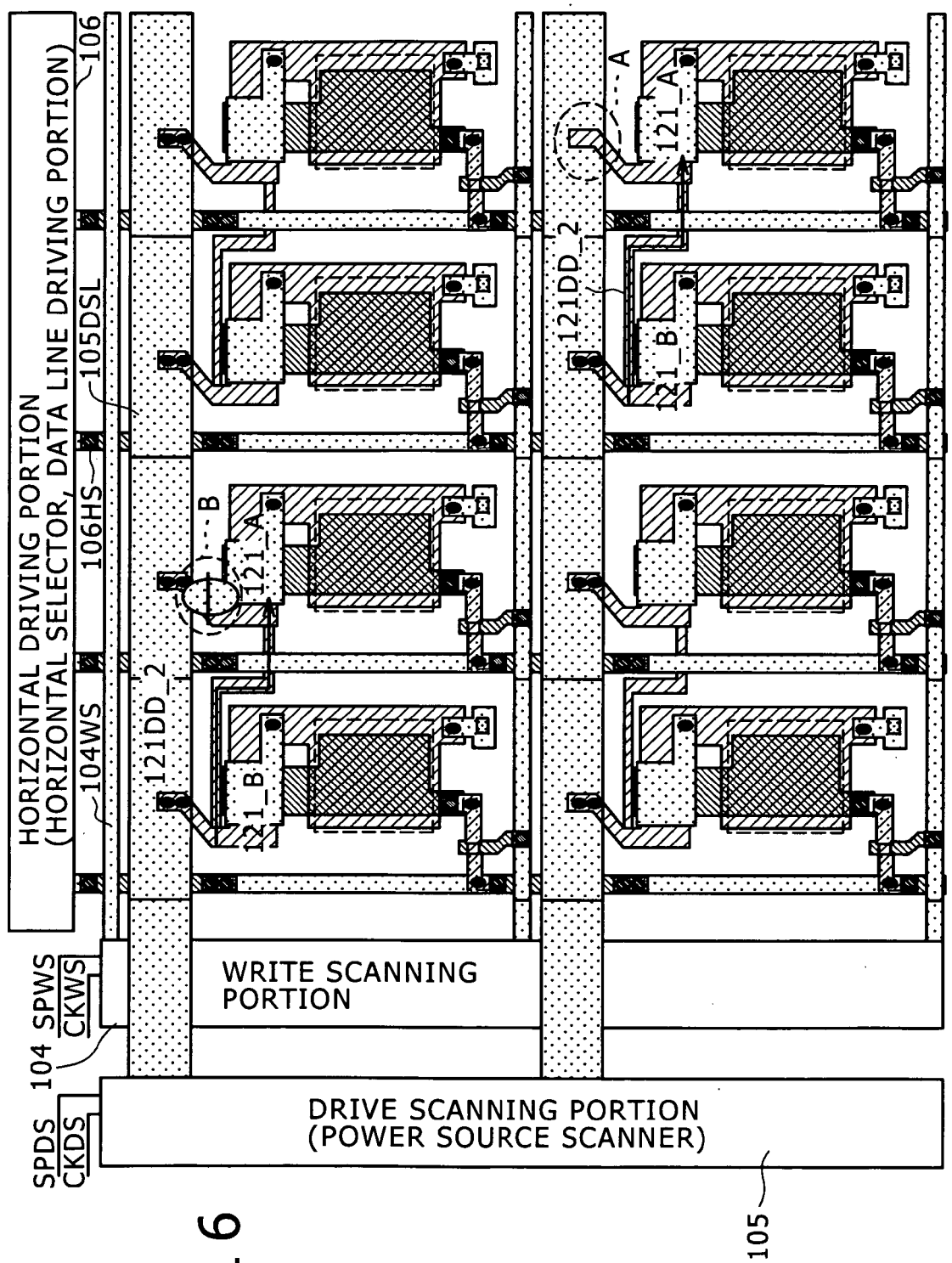
FIG. 16 is a top plan view showing a layout for two rows and four columns according to the first example of the third embodiment to which the layout shown in FIG. 15 is applied.
Figure 17:
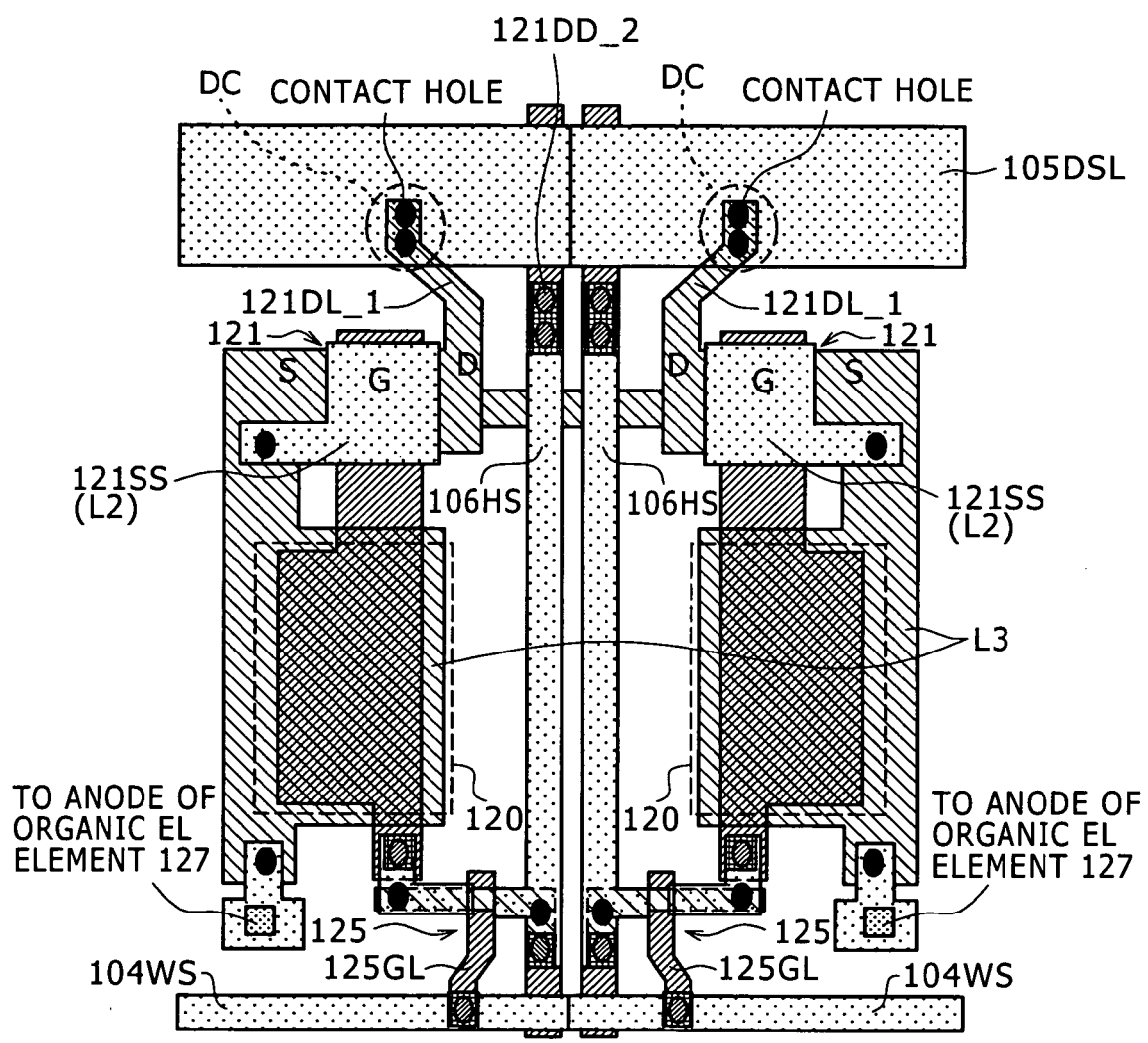
FIG. 17 is a top plan view showing a layout for two pixels according to a second example of the third embodiment of the present invention.
Figure 18:
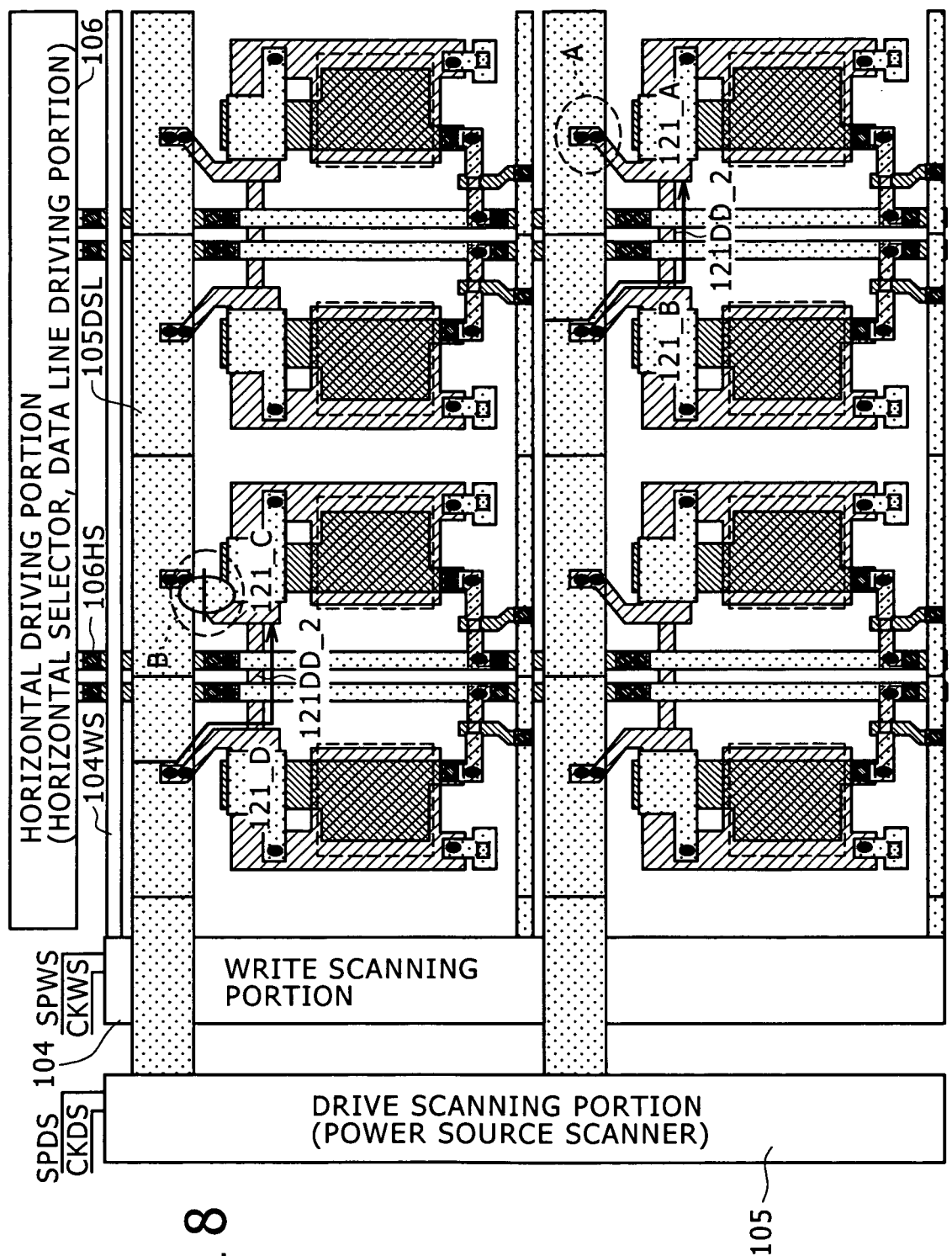
FIG. 18 is a top plan view showing a layout for two rows and four columns according to the second example of the third embodiment to which the layout shown in FIG. 17 is applied.
Figure 19:
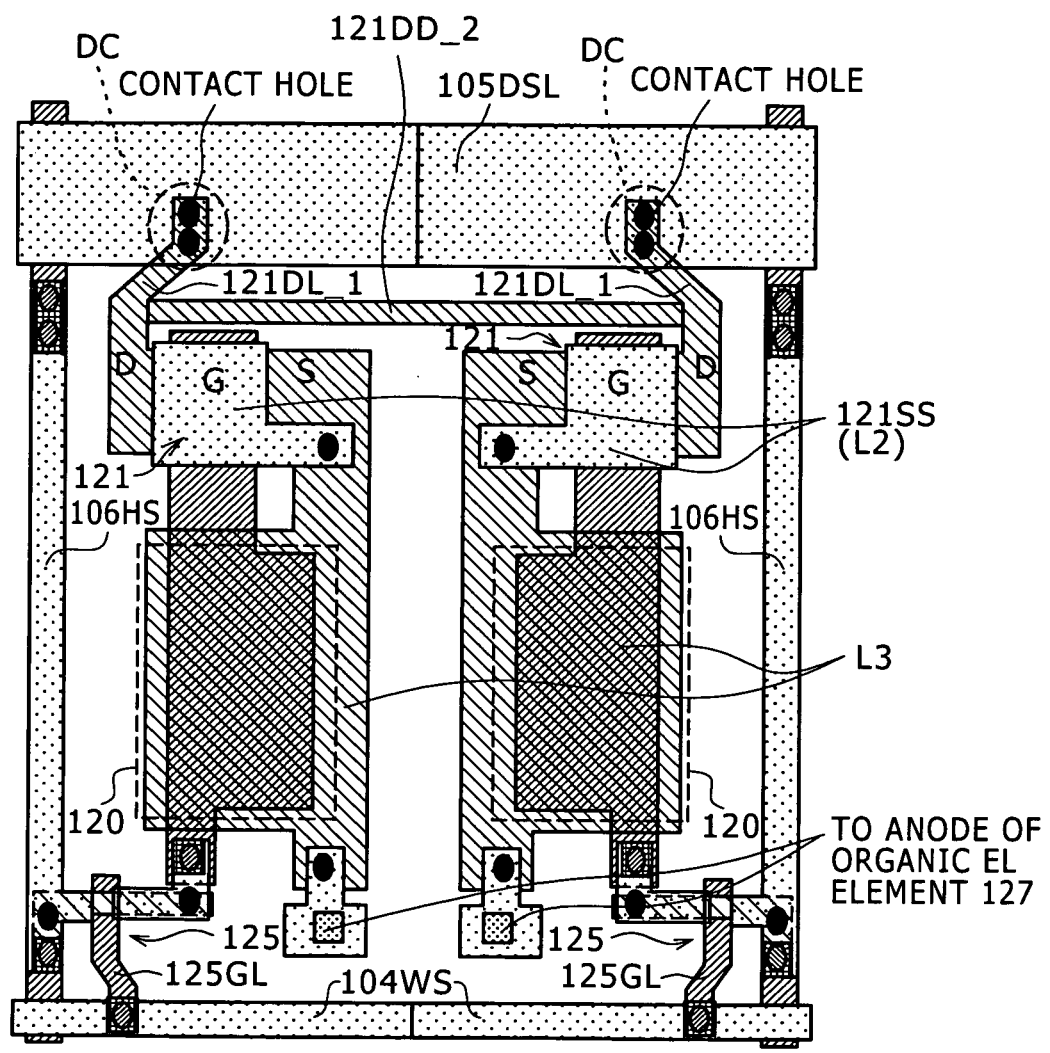
FIG. 19 is a top plan view showing a layout for two pixels according to a third example of the third embodiment of the present invention.
Figure 20:
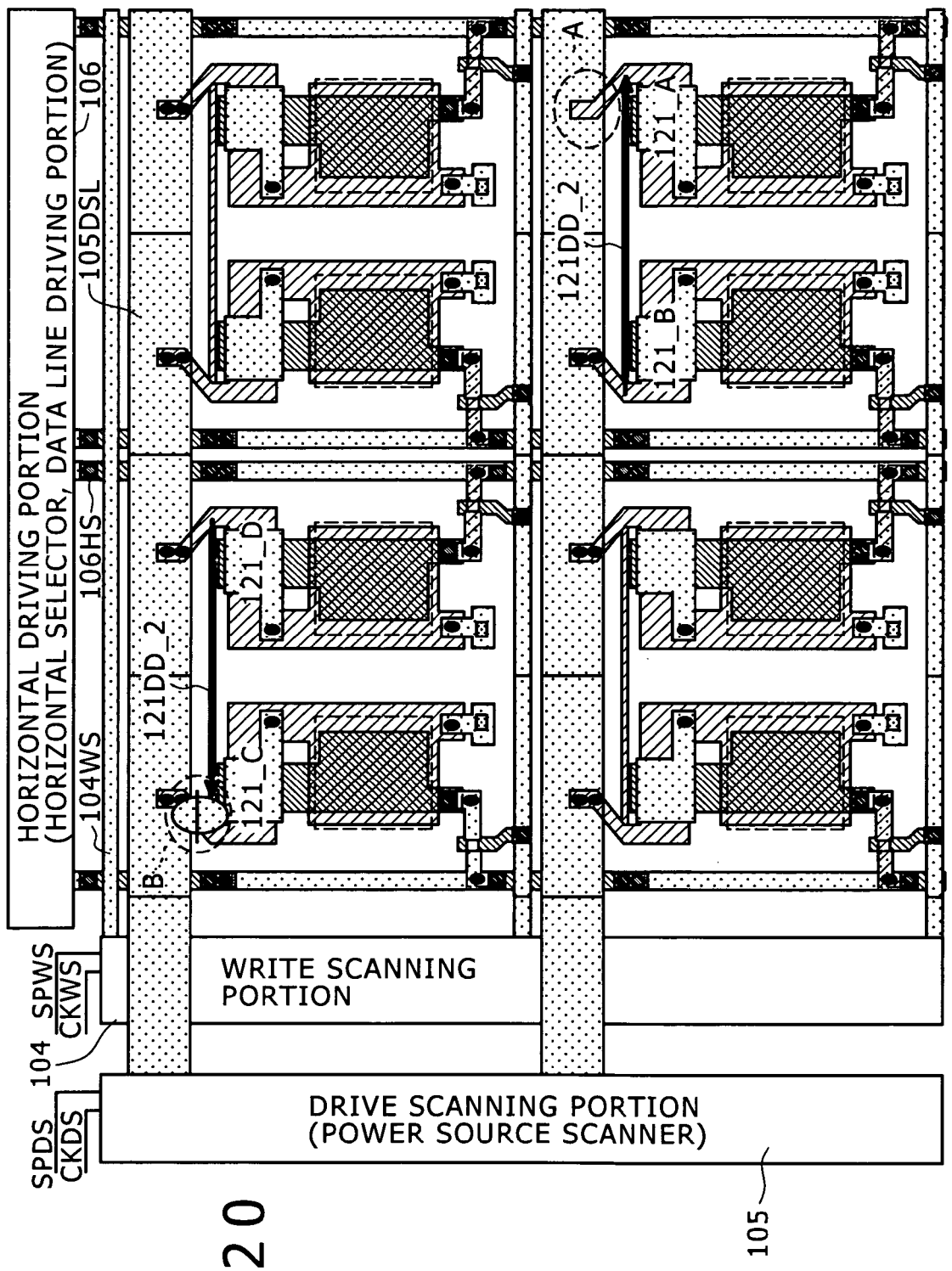
FIG. 20 is a top plan view showing a layout for two rows and four columns according to the third example of the third embodiment to which the layout shown in FIG. 19 is applied.
Figure 21:
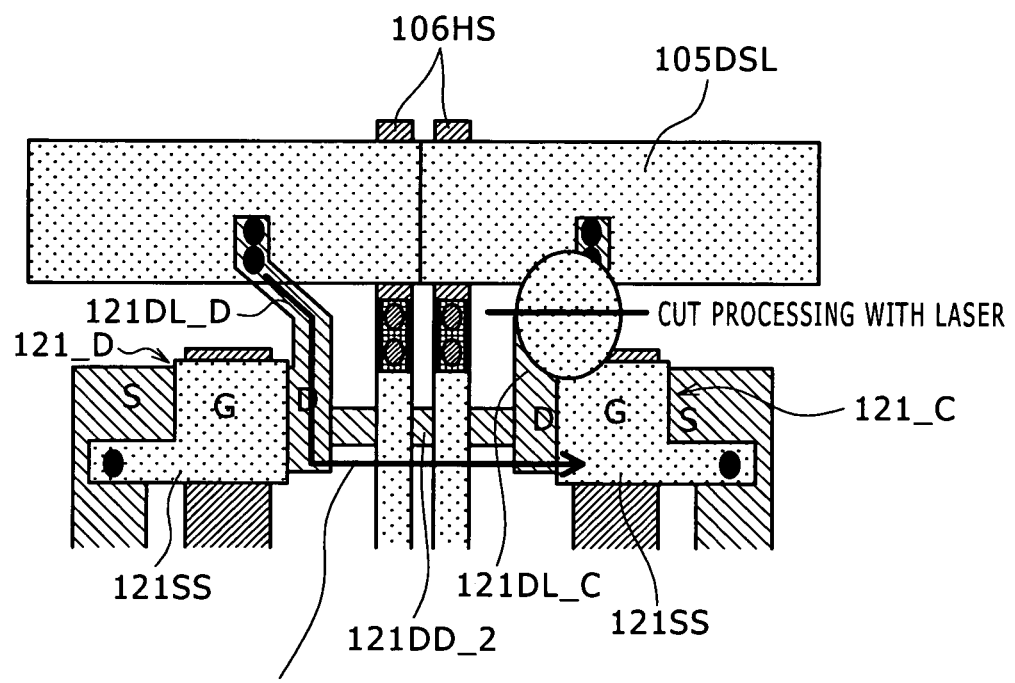
FIG. 21 is a top plan view explaining an effect of measures taken to cope with source shield power source short-circuit in the third embodiment.

FIGS. 15 to 21 are respectively top plan views explaining a mechanism in pixel circuits P in a display device according to a third embodiment of the present invention. Here, FIG. 15 is a top plan view showing a layout for two pixels according to a first example of the third embodiment, and FIG. 16 is a top plan view showing a layout for two rows and four columns according to the first example of the third embodiment to which the layout shown in FIG. 15 is applied. FIG. 17 is a top plan view showing a layout for two pixels according to a second example of the third embodiment, and FIG. 18 is a top plan view showing a layout for two rows and four columns according to the second example of the third embodiment to which the layout shown in FIG. 17 is applied. Also, FIG. 19 is a top plan view showing a layout for two pixels according to a third example of the third embodiment, and FIG. 20 is a top plan view showing a layout for two rows and four columns according to the third example of the third embodiment to which the layout shown in FIG. 19 is applied. Also, FIG. 21 is a top plan view explaining an effect of measures taken to cope with source shield power source short-circuit in the third embodiment.

A mechanism of the third embodiment is similar to that of each of the first and second embodiments in that the power source contact portions DC which one drive transistor 121 can use are provided at distances from one another in a plurality of portions, thereby improving the contact failure caused between the power source supply line 105DSL and the extension wiring 121DL. The third embodiment is different from the first embodiment in that the drain terminals D as the power source terminals of the drive transistors 121 of a plurality of (preferably, adjacent) pixel circuits P are commonly connected to one another. A point of difference between the first example, and each of the second and third examples is whether or not a layout of one pixel circuit P of two pixel circuits P adjacent to each other in the same row is mirror-inverted (whether or not the layouts of the adjacent two pixel circuits P exhibit a mirror inversion relationship). A combination of the adjacent two pixel circuits P the extension wirings 121DL of which are commonly connected to each other and the layouts of which exhibit the mirror inversion relationship is different between the second example and the third example.

Note that, the third embodiment is similar to the second embodiment described above in that the drain terminals D of the adjacent two pixel circuits P are commonly connected to each other. However, the third embodiment is different from the second embodiment described above in that a wiring through which the drain terminals D of the adjacent two pixel circuits P are commonly connected to each other (hereinafter referred to as "a power source common line 121DD_2") is disposed so as to extend from one drain terminal side to the other drain terminal side of the drive transistors 121 within the adjacent two pixel circuits P. Adoption of such a mechanism takes the measures to cope with the contact failure and the source shield power source short-circuit due to the mistake in the photolithography or the etching in the process for manufacturing a transistor. The third embodiment is different from each of the first and second embodiments in that each of the first and second embodiments may not take the measures to cope with the source shield power source short-circuit.

For example, each of the first and second examples of the third embodiment adopts such a combination layout that for the adjacent two pixel circuits P, the power source common connection line 121DD_2 for common connection intersects with the video signal line 106HS for the corresponding pixel circuits P. On the other hand, the third example of the third embodiment adopts such a combination layout system that for the adjacent two pixel circuits P exhibiting the mirror inversion relationship, the power source common connection line 121DD_2 for common connection does not intersect with the video signal line 106HS for the corresponding pixel circuits P. The second example of the third embodiment exhibits the mirror inversion relationship in combination in which the length of the power source common connection line 121DD_2 becomes short. On the other hand, the third example of the third embodiment exhibits the mirror inversion relationship in combination in which the length of the power source common connection line 121DD_2 becomes long.

Any of the first to third examples of the third embodiment adopts the layout system that the extension wirings 121DL of the pixel circuits P as the object of the combination are connected to each other through the power source common connection line 121DD_2 disposed within the corresponding pixel circuits P. The third embodiment is different from the second embodiment in that the power source common connection line 121DD_2 is not disposed in parallel with the power source supply line 105DSL, but is disposed so as to extend from one drain terminal side to the other drain terminal side, of the adjacent two drive transistors 121, disposed apart from the power source supply line 105DSL. Although not illustrated, any of the first to third examples of the third embodiment may take the measures to cope with the short-circuit caused between the scanning lines by providing the slit holes SH as in the case of the second embodiment. In the case of the third embodiment, the power source common connection line 121DD_2 is not wired in the intersection portion between the power source supply line 105DSL and another scanning line (the video signal line 106HS). Therefore, the application of the third embodiment is easily carried out similarly to the third example of the second embodiment.

Even when the power source supply line 105DSL and the extension wiring 121DL may not be connected to each other because none of the contact holes is opened in the power source contact portion DC in the extension wiring 121DL of one side (the drive transistor 121_A) of the adjacent two drive transistors 121 (refer to a portion A shown in each of FIGS. 16, 18 and 20), the power source supply line 105DSL and the drain terminal D of the drive transistor 121_A are connected to each other in the power source contact portion DC in the extension wiring 121DL on the other drive transistor 121_B side adjacent to that one drive transistor 121_A side through the power source common connection line 121DD_2. As a result, even when the contact failure is caused, the drain voltage can be applied to the drive transistor 121_A, thereby making it possible to suppress the occurrence of the vanishing point. Also, the contact margin can be increased, thereby making it possible to prevent the occurrence of the display defect (point defect) due to the contact failure caused by the photolithography mistake or the etching mistake causing the point defect. As a result, the high yield can be realized.

In addition, even when the source shield power source short-circuit is caused due to the mistake in the photolithography or the etching in the process for manufacturing a transistor (refer to a portion B shown in each of FIGS. 16, 18 and 20), the short-circuited portion can be laser-repaired. The isolayer short-circuit is caused between the power source supply line 105DSL in the second wiring layer L2, and the source shield 121SS of the drive transistor 121_C. However, a cut (indicated by a heavy line in each of the figures) is made in the isolayer short-circuited portion by using the laser beam to cut the isolayer short-circuited portion, thereby making it possible to separate the power source supply line 105DSL and the source shield 121SS of the drive transistor 121 from each other.

At this time, since as shown in FIG. 21 (in which the second example is taken as an example in this case), another wiring layer (the extension wiring 121DL_C in this case) exists in the short-circuited portion, the extension wiring 121DL_C is also cut off together with the source shield 121SS of the drive transistor 121_C. As a result, within the same pixel circuit P, the drain terminal D of the drive transistor 121_C, and the power source supply line 105DSL are separated from each other. Factually, this state is identical to a state in which the contact hole through which the extension wiring 121DL_C and the power source supply line 105DSL are intended to be connected to each other is not bored.

However, with the mechanism of the third embodiment, the power source common connection line 121DD_2 is disposed on the drain sides of the adjacent two drive transistors 121 within the corresponding pixel circuits P. Therefore, the power source supply line 105DSL, and the drain terminal D of the drive transistor 121_C are connected to each other through the power source contact portion DC on the extension wiring 121DL_D side of the other drive transistor 121_D adjacent to the drive transistor 121_C through the power source common connection line 121DD_2. Any of the vanishing points is prevented from occurring because the drain voltage is applied from the extension wiring 121DL of the adjacent pixel circuit to the other drive transistor 121. As a result, even when the source shield power source short-circuit is caused with which it is difficult for the existing pixel layout to cope, the short-circuit state can be solved by carrying out the laser repair, and the drain voltage can be applied to the drain transistor 121. Therefore, it is possible to suppress the occurrence of the luminescent spot or the vanishing point.

As has been described, with the mechanism of the third embodiment, the contact margin can be increased, thereby preventing the occurrence of the vanishing point due to the contact failure. Also, the source shield power source short-circuit is laser-repaired, thereby making it possible to prevent the occurrence of the luminescent spot. As a result, the number of point defects (vanishing points or luminescent spots) can be reduced, thereby realizing the high yield.

Here, in the first example, the distribution of the power source common connection line 121DD_2 is uneasy, and in the third example, the power source common connection line 121DD_2 becomes long. On the other hand, in the second example, the power source common connection line 121DD_2 is wired between the drain terminals D of the drive transistors 121, facing each other, of the adjacent two pixel circuits P as the object of the combination. Therefore, factually, the drain terminals D of the drive transistors 121 facing each other can be directly connected to each other with a straight line by the most direct way.

In addition, in each of the first and third examples, the power source common connection line 121DD_2 is compelled to be wired between the third wiring layer L3, for the hold capacitor 120, extending from the source terminal S of the drive transistor 121, and the power source supply line 105DSL. Therefore, attention should be paid so as not to cut out the power source common connection line 121DD_2 because the power source common connection line 121DD_2 becomes an obstacle in the phase of laser repair of the source shield power source short-circuit. On the other hand, in the second example, it is unnecessary to wire the power source common connection line 121DD_2 between the third wiring layer L3, for the hold capacitor 120, extending from the source terminal S of the drive transistor 121, and the power source supply line 105DSL. Thus, the power source common connection line 121DD_2 can be wired so as to extend from one predetermined position to the other within the adjacent two pixel circuits P away from the power source supply line 105DSL. As a result, the power source common connection line 121DD_2 is prevented from becoming the obstacle in the phase of laser repair of the source shield power source short-circuit.

In a word, comparing the first to third examples with one another from a viewpoint of the measures taken to cope with the source shield power source short-circuit, when the distribution, the length and the like of the power source common connection line 121DD_2 are taken into consideration, each of the second and third examples having the respective mirror dispositions is more preferable than the first example. Moreover, the form of the mirror disposition is more preferable in the second example than in the third example. Note that, when the first to third examples are compared with one another from a viewpoint of the measures taken to cope with the contact failure caused between the extension wiring 121DL and the power source supply line 105DSL, the third example having the longest distance between the adjacent two power source contact portions DC is optimal, followed by the first example and the second example. The reason for this is because it is important to prevent all the power source contact portions DC for the adjacent two pixel circuits P from being provided within the mistake occurrence range similarly to the second embodiment.

The present application contains subject matter related to that disclosed in Japanese Priority Patent Application JP 2008-140310 filed in the Japan Patent Office on May 29, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:
1. A display device, comprising:
a pixel array portion having pixel circuits disposed in a matrix, each of said pixel circuits including a drive transistor disposed at a first wiring layer for generating a drive current, and an electro-optic element connected to an output terminal of said drive transistor, and power source supply lines disposed at a second wiring layer different from the first wiring layer as scanning lines through which pulse-like power source voltages are supplied to power source supply terminals of the drive transistors disposed at the first wiring layer, respectively, wired therein; and
a plurality of extension wiring pieces, respective ones of the plurality of extension wiring pieces electrically connected to and between respective ones of the power source supply lines and the power source supply terminals, each one of the plurality of extension wiring pieces having a strip configuration and at least one extension wiring connection segment overlapping the respective one of the power source supply lines, extending in a scanning direction thereacross and sized to accommodate at least two power source contact portions, wherein respective ones of the power source supply lines include at least two contact holes aligned with and corresponding to each one of the plurality of the extension wiring pieces and extending therethough to the respective ones of the plurality of extension wiring pieces, wherein respective ones of the at least two power source contact portions are disposed in and through the respective ones of the at least two contact holes to electrically connect the corresponding power source supply line and the at least one extension wiring connection segment and wherein the power source contact portions through which the corresponding one of said power source supply terminals and the corresponding one of said power source supply lines are connected to each other are provided at predetermined spaced-apart distances extending perpendicularly to a scanning line direction from one another in a plurality of portions for every drive transistor.

2. The display device according to claim 1, wherein a power source common connection line through which said power source contact portions of said plurality of drive transistors are connected to one another is provided.

3. The display device according to claim 2, wherein said plurality of drive transistors to which said power source contact portions are connected through said power source common connection line belong to the pixel circuits adjacent to each other; and
a layout of one of the pixel circuits adjacent to each other, and a layout of the other of the pixel circuits adjacent to each other exhibit a mirror inversion relationship.

4. The display device according to claim 3, wherein the layout of the one of the pixel circuits adjacent to each other, and the layout of the other of the pixel circuits adjacent to each other exhibit the mirror inversion relationship in combination in which said power source common connection line is long.

5. The display device according to claim 3, wherein the layout of the one of the pixel circuits adjacent to each other, and the layout of the other of the pixel circuits adjacent to each other exhibit the mirror inversion relationship in combination in which said power source common connection line is short.

6. The display device according to claim 2, wherein said power source common connection line is wired in parallel with each of said power source supply lines in a layer different from that of each of said power source supply lines.

7. The display device according to claim 2, wherein said power source common connection line is wired in a position away from the corresponding one of said power source supply lines within the corresponding one of said pixel circuits.

8. The display device according to claim 7, wherein said power source common connection line is wired between the corresponding two of said power source supply terminals in the corresponding two of the drive transistors facing each other.

9. The display device according to claim 2, wherein other scanning lines are wired so as to intersect with said power source supply lines;
said power source common connection line is wired so as not to intersect with each of said other scanning lines; and
a slit portion for separating short-circuit between the scanning lines by carrying out cut processing is formed in each of intersection portions between said power source supply lines and said other scanning lines.

10. The display device according to claim 1, wherein each one of the plurality of extension wiring pieces includes two extension wiring connection segments disposed apart from and extending parallel to each other and electrically interconnected by a cross segment extending in the scanning line direction.

11. The display device according to claim 10, wherein one of the two extension wiring connection segments electrically connects a respective one of the power source supply lines and a first pixel circuit and a remaining one of the two extension wiring connection segments electrically connects the respective one of the power source supply lines and a second pixel circuit juxtaposed to the first pixel circuit.

12. The display device according to claim 1, wherein one of the plurality of extension wiring pieces is electrically connected to and between a respective one of the power source supply lines and the power source supply terminal of a first pixel circuit, another one of the plurality of extension wiring pieces is electrically connected to and between a respective one of the power source supply lines and the power source supply terminal of a second pixel circuit juxtaposed to the first pixel circuit, the one and the another one of the plurality of extension wiring pieces being electrically interconnected by a cross segment extending in the scanning line direction.

13. A display device, comprising:
pixel array means having pixel circuits disposed in a matrix, each of said pixel circuits including a drive transistor disposed at a first wiring layer for generating a drive current, and an electro-optic element connected to an output terminal of said drive transistor, and power source supply lines disposed at a second wiring layer different from the first wiring layer as scanning lines through which pulse-like power source voltages are supplied to power source supply terminals of the drive transistors disposed at the first wiring layer, respectively, wired therein; and
a plurality of extension wiring pieces, respective ones of the plurality of extension wiring pieces electrically connected to and between respective ones of the power source supply lines and the power source supply terminals, each one of the plurality of extension wiring pieces having a strip configuration and at least one extension wiring connection segment overlapping the respective one of the power source supply lines, extending in a scanning direction thereacross and sized to accommodate at least two power source contact portions, wherein respective ones of the power source supply lines include at least two contact holes aligned with and corresponding to each one of the plurality of the extension wiring pieces and extending therethough to the respective ones of the plurality of extension wiring pieces, wherein respective ones of the at least two power source contact portions are disposed in and through the respective ones of the at least two contact holes to electrically connect the corresponding power source supply line and the at least one extension wiring connection segment and wherein the power source contact portions through which the corresponding one of said power source supply terminals and the corresponding one of said power source supply lines are connected to each other are provided at predetermined spaced-apart distances extending perpendicularly to a scanning line direction from one another in a plurality of portions for every drive transistor.

* * * * *